(12) United States Patent
Stephen et al.

(10) Patent No.: US 6,484,283 B2
(45) Date of Patent: *Nov. 19, 2002

(54) METHOD AND APPARATUS FOR ENCODING AND DECODING A TURBO CODE IN AN INTEGRATED MODEM SYSTEM

(75) Inventors: Karen J. Stephen, Carlsbad, CA (US); Hon W. Lam, Carlsbad, CA (US); Jonathan Cromwell, Solana Beach, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,473

(22) Filed: Dec. 30, 1998

(65) Prior Publication Data

US 2002/0029362 A1 Mar. 7, 2002

(51) Int. Cl.⁷ .............................................. H03M 13/03
(52) U.S. Cl. ...................................................... 714/786
(58) Field of Search .......................................... 714/786

(56) References Cited

U.S. PATENT DOCUMENTS

| | | | | |
|---|---|---|---|---|
| 5,392,299 A | * | 2/1995 | Rhines et al. | 714/756 |
| 5,721,745 A | * | 2/1998 | Hladik et al. | 714/755 |
| 5,734,962 A | * | 3/1998 | Hladik et al. | 455/12.1 |
| 5,910,967 A | * | 6/1999 | Vanderaar | 375/265 |
| 5,996,104 A | * | 11/1999 | Herzberg | 714/755 |
| 6,000,054 A | * | 12/1999 | Bahr et al. | 714/786 |
| 6,005,897 A | * | 12/1999 | McCallister et al. | 375/340 |
| 6,023,783 A | * | 2/2000 | Divsalar et al. | 714/792 |

OTHER PUBLICATIONS

Shu Lin and Daniel Costello, "Error Control Coding: Fundamentals and Applications", Prentice Hall, 1983.*
Stephen B. Wicker, "Error Control Systems for Digitil Communication and Storage", Prentice Hall, 1995.*
J.I. Statman, K.–M. Cheung, T.H. Chauvin, J. Rabkin and M.L. Belongie, "Decoder Synchronization for Deep Space Missions", TDA Progress Report 42–116, Feb. 15, 1994.*
D. Divsalar and F. Pollara, "Hybrid Concatenated Codes and Iterative Decoding", TDA Progress Report 42–130, Aug. 15, 1997.*
S. Benedetto, D. Divsalar, G. Montorsi and F. Pollara, "Soft–Output Decoding Algorithms in Iterative Decoding of Turbo Codes", TDA Progress Report 42–124, Feb. 15, 1996.*
D. Divsalar and F. Pollara, "On the Design of Turbo Codes", TDA Progress Report 42–123, Nov. 15, 1995.*

* cited by examiner

Primary Examiner—Albert Decady
Assistant Examiner—Joseph D. Torres
(74) Attorney, Agent, or Firm—Blakely, Sokoloff, Taylor & Zafman LLP

(57) ABSTRACT

The present invention is a method and apparatus for encoding and decoding a turbo code. In the encoder, an interleaver interleaves and delays a block of input bits to generate interleaved input bits and delayed input bits. A first encoder generates a first, second, and third encoded bits. A second encoder generates a fourth encoded bit. A symbol generator generates a plurality of symbols which correspond to the input bits. In a decoder, a sync search engine detects a synchronizing pattern and extracts symbols from the encoded bits. An input buffer is coupled to the sync search engine to store the extracted symbols. A first soft-in-soft-out (SISO1) is coupled to the input buffer to generate a first soft decision set based on the extracted symbols. An interleaver is coupled to the SISO1 to interleave the first soft decision set. A second soft-in-soft-out (SISO2) is coupled to the input buffer and the interleaver to generate a second soft decision set. A de-interleaver is coupled to the SISO2 to de-interleave the second soft decision set. An adder is coupled to the SISO1 and the de-interleaver to generate a hard decision set.

65 Claims, 21 Drawing Sheets

| u1 | u2 | m0 | m2 | m1 | m3 | CS | m0' | m2' | m1' | m3' | NS | c |
|----|----|----|----|----|----|----|-----|-----|-----|-----|----|---|
| 0 | 0 | 0 | 0 | 0 | 0 | 0 | 0 | 0 | 0 | 0 | 0 | 0 |
| 0 | 0 | 0 | 0 | 0 | 1 | 1 | 0 | 1 | 0 | 0 | 4 | 0 |
| 0 | 0 | 0 | 0 | 1 | 0 | 2 | 1 | 1 | 0 | 0 | 12 | 0 |
| 0 | 0 | 0 | 0 | 1 | 1 | 3 | 1 | 0 | 0 | 0 | 8 | 0 |
| 0 | 0 | 0 | 1 | 0 | 0 | 4 | 1 | 1 | 0 | 1 | 13 | 0 |
| 0 | 0 | 0 | 1 | 0 | 1 | 5 | 1 | 0 | 0 | 1 | 9 | 0 |
| 0 | 0 | 0 | 1 | 1 | 0 | 6 | 0 | 0 | 0 | 1 | 1 | 0 |
| 0 | 0 | 0 | 1 | 1 | 1 | 7 | 0 | 1 | 0 | 1 | 5 | 0 |
| 0 | 0 | 1 | 0 | 0 | 0 | 8 | 0 | 0 | 1 | 0 | 2 | 1 |
| 0 | 0 | 1 | 0 | 0 | 1 | 9 | 0 | 1 | 1 | 0 | 6 | 1 |
| 0 | 0 | 1 | 0 | 1 | 0 | 10 | 1 | 1 | 1 | 0 | 14 | 1 |
| 0 | 0 | 1 | 0 | 1 | 1 | 11 | 1 | 0 | 1 | 0 | 10 | 1 |
| 0 | 0 | 1 | 1 | 0 | 0 | 12 | 1 | 1 | 1 | 1 | 15 | 1 |
| 0 | 0 | 1 | 1 | 0 | 1 | 13 | 1 | 0 | 1 | 1 | 11 | 1 |
| 0 | 0 | 1 | 1 | 1 | 0 | 14 | 0 | 0 | 1 | 1 | 3 | 1 |
| 0 | 0 | 1 | 1 | 1 | 1 | 15 | 0 | 1 | 1 | 1 | 7 | 1 |
| 0 | 1 | 0 | 0 | 0 | 0 | 0 | 0 | 1 | 0 | 0 | 4 | 1 |
| 0 | 1 | 0 | 0 | 0 | 1 | 1 | 0 | 0 | 0 | 0 | 0 | 1 |
| 0 | 1 | 0 | 0 | 1 | 0 | 2 | 1 | 0 | 0 | 0 | 8 | 1 |
| 0 | 1 | 0 | 0 | 1 | 1 | 3 | 1 | 1 | 0 | 0 | 12 | 1 |
| 0 | 1 | 0 | 1 | 0 | 0 | 4 | 1 | 0 | 0 | 1 | 9 | 1 |
| 0 | 1 | 0 | 1 | 0 | 1 | 5 | 1 | 1 | 0 | 1 | 13 | 1 |
| 0 | 1 | 0 | 1 | 1 | 0 | 6 | 0 | 1 | 0 | 1 | 5 | 1 |
| 0 | 1 | 0 | 1 | 1 | 1 | 7 | 0 | 0 | 0 | 1 | 1 | 1 |
| 0 | 1 | 1 | 0 | 0 | 0 | 8 | 0 | 1 | 1 | 0 | 6 | 0 |
| 0 | 1 | 1 | 0 | 0 | 1 | 9 | 0 | 0 | 1 | 0 | 2 | 0 |
| 0 | 1 | 1 | 0 | 1 | 0 | 10 | 1 | 0 | 1 | 0 | 10 | 0 |
| 0 | 1 | 1 | 0 | 1 | 1 | 11 | 1 | 1 | 1 | 0 | 14 | 0 |
| 0 | 1 | 1 | 1 | 0 | 0 | 12 | 1 | 0 | 1 | 1 | 11 | 0 |
| 0 | 1 | 1 | 1 | 0 | 1 | 13 | 1 | 1 | 1 | 1 | 15 | 0 |
| 0 | 1 | 1 | 1 | 1 | 0 | 14 | 0 | 1 | 1 | 1 | 7 | 0 |
| 0 | 1 | 1 | 1 | 1 | 1 | 15 | 0 | 0 | 1 | 1 | 3 | 0 |

*FIG. 3A*

| u1 | u2 | m0 | m2 | m1 | m3 | CS | m0' | m2' | m1' | m3' | NS | c |
|---|---|---|---|---|---|---|---|---|---|---|---|---|
| 1 | 0 | 0 | 0 | 0 | 0 | 0 | 1 | 0 | 0 | 0 | 8 | 1 |
| 1 | 0 | 0 | 0 | 0 | 1 | 1 | 1 | 1 | 0 | 0 | 12 | 1 |
| 1 | 0 | 0 | 0 | 1 | 0 | 2 | 0 | 1 | 0 | 0 | 4 | 1 |
| 1 | 0 | 0 | 0 | 1 | 1 | 3 | 0 | 0 | 0 | 0 | 0 | 1 |
| 1 | 0 | 0 | 1 | 0 | 0 | 4 | 0 | 1 | 0 | 1 | 5 | 1 |
| 1 | 0 | 0 | 1 | 0 | 1 | 5 | 0 | 0 | 0 | 1 | 1 | 1 |
| 1 | 0 | 0 | 1 | 1 | 0 | 6 | 1 | 0 | 0 | 1 | 9 | 1 |
| 1 | 0 | 0 | 1 | 1 | 1 | 7 | 1 | 1 | 0 | 1 | 13 | 1 |
| 1 | 0 | 1 | 0 | 0 | 0 | 8 | 1 | 0 | 1 | 0 | 10 | 0 |
| 1 | 0 | 1 | 0 | 0 | 1 | 9 | 1 | 1 | 1 | 0 | 14 | 0 |
| 1 | 0 | 1 | 0 | 1 | 0 | 10 | 0 | 1 | 1 | 0 | 6 | 0 |
| 1 | 0 | 1 | 0 | 1 | 1 | 11 | 0 | 0 | 1 | 0 | 2 | 0 |
| 1 | 0 | 1 | 1 | 0 | 0 | 12 | 0 | 1 | 1 | 1 | 7 | 0 |
| 1 | 0 | 1 | 1 | 0 | 1 | 13 | 0 | 0 | 1 | 1 | 3 | 0 |
| 1 | 0 | 1 | 1 | 1 | 0 | 14 | 1 | 0 | 1 | 1 | 11 | 0 |
| 1 | 0 | 1 | 1 | 1 | 1 | 15 | 1 | 1 | 1 | 1 | 15 | 0 |
| 1 | 1 | 0 | 0 | 0 | 0 | 0 | 1 | 1 | 0 | 0 | 12 | 0 |
| 1 | 1 | 0 | 0 | 0 | 1 | 1 | 1 | 0 | 0 | 0 | 8 | 0 |
| 1 | 1 | 0 | 0 | 1 | 0 | 2 | 0 | 0 | 0 | 0 | 0 | 0 |
| 1 | 1 | 0 | 0 | 1 | 1 | 3 | 0 | 1 | 0 | 0 | 4 | 0 |
| 1 | 1 | 0 | 1 | 0 | 0 | 4 | 0 | 0 | 0 | 1 | 1 | 0 |
| 1 | 1 | 0 | 1 | 0 | 1 | 5 | 0 | 1 | 0 | 1 | 5 | 0 |
| 1 | 1 | 0 | 1 | 1 | 0 | 6 | 1 | 1 | 0 | 1 | 13 | 0 |
| 1 | 1 | 0 | 1 | 1 | 1 | 7 | 1 | 0 | 0 | 1 | 9 | 0 |
| 1 | 1 | 1 | 0 | 0 | 0 | 8 | 1 | 1 | 1 | 0 | 14 | 1 |
| 1 | 1 | 1 | 0 | 0 | 1 | 9 | 1 | 0 | 1 | 0 | 10 | 1 |
| 1 | 1 | 1 | 0 | 1 | 0 | 10 | 0 | 0 | 1 | 0 | 2 | 1 |
| 1 | 1 | 1 | 0 | 1 | 1 | 11 | 0 | 1 | 1 | 0 | 6 | 1 |
| 1 | 1 | 1 | 1 | 0 | 0 | 12 | 0 | 0 | 1 | 1 | 3 | 1 |
| 1 | 1 | 1 | 1 | 0 | 1 | 13 | 0 | 1 | 1 | 1 | 7 | 1 |
| 1 | 1 | 1 | 1 | 1 | 0 | 14 | 1 | 1 | 1 | 1 | 15 | 1 |
| 1 | 1 | 1 | 1 | 1 | 1 | 15 | 1 | 0 | 1 | 1 | 11 | 1 |

*FIG. 3B*

|    | I(m103) | Q(m147) | I,Q |
|----|---------|---------|-----|
| 1  | 1       | 0       | 2   |
| 2  | 0       | 0       | 0   |
| 3  | 1       | 1       | 3   |
| 4  | 1       | 1       | 3   |
| 5  | 1       | 0       | 2   |
| 6  | 0       | 0       | 0   |
| 7  | 1       | 0       | 2   |
| 8  | 1       | 1       | 3   |
| 9  | 0       | 1       | 1   |
| 10 | 1       | 1       | 3   |
| 11 | 0       | 0       | 0   |
| 12 | 0       | 1       | 1   |
| 13 | 1       | 0       | 2   |
| 14 | 0       | 1       | 1   |
| 15 | 0       | 1       | 1   |
| 16 | 1       | 1       | 3   |
| 17 | 1       | 1       | 3   |
| 18 | 1       | 1       | 3   |
| 19 | 0       | 1       | 1   |
| 20 | 0       | 0       | 0   |
| 21 | 0       | 1       | 1   |
| 22 | 1       | 1       | 3   |
| 23 | 0       | 0       | 0   |
| 24 | 1       | 1       | 3   |
| 25 | 1       | 0       | 2   |
| 26 | 1       | 0       | 2   |
| 27 | 1       | 0       | 2   |
| 28 | 0       | 1       | 1   |
| 29 | 0       | 0       | 0   |
| 30 | 1       | 0       | 2   |
| 31 | 0       | 0       | 0   |
| 32 | 1       | 0       | 2   |
| 33 | 0       | 1       | 1   |
| 34 | 0       | 0       | 0   |
| 35 | 0       | 1       | 1   |
| 36 | 1       | 1       | 3   |
| 37 | 1       | 0       | 2   |
| 38 | 0       | 0       | 0   |
| 39 | 0       | 1       | 1   |
| 40 | 0       | 0       | 0   |

METHOD AND APPARATUS FOR ENCODING AND DECODING A TURBO CODE IN AN INTEGRATED MODEM SYSTEM

BACKGROUND

1. Field of the Invention

The present invention relates to communication systems. In particular, the present invention relates to the encoding and decoding of the Turbo code for use in an integrated modem system.

2. Description of Related Art

Coded digital communication techniques play an important role in modern communication systems. The objectives of error-correcting coding and decoding of information include the improvement of communication reliability and efficiency. In 1948, Claude Shannon demonstrated that by proper encoding and decoding of information, errors induced by a noisy channel could be reduced to any desired level, subject to a code rate constraint.

A channel encoder is characterized by three parameters: (1) the number of codewords in the codeword dictionary, or simply the code, $M_c$; (2) the dimensionality (codeword length) of the code $N_c$; and (3) the code rate $r_c$ defined as $r_c = \log_2 M_c / N_c$ bits/dimension. There are two types of code: the linear block code and convolutional codes. The linear ($N_c$, $K_c$) block code can be used for error control purposes by partitioning the data stream into blocks containing $K_c$ bits each. An $N_c$-symbol codeword is formed for transmission by using an encoding rule to associate the $r = N_c - K_c$ parity check bits with each $K_c$ data bits. In contrast, the encoded data in convolutional codes do not have a simple block structure. A convolutional encoder operates on the input bit stream such that each information bit can affect a finite number of consecutive symbols in the encoder output.

Techniques for encoding and decoding convolutional codes are well known. The Viterbi algorithm (VA) is an elegant and efficient method for performing maximum likelihood (ML) decoding of convolutional codes. Powerful error-correction capability can be obtained by concatenating a Viterbi decoded convolutional code with a Reed-Solomon (RS) block code. The theory, design, and performance of the convolutional codes are discussed extensively in literature. Examples of the literature include "Digital Communication Techniques: Signal design and detection" by Marvin K. Simon, Sami M. Hinedi, and William C. Lindsey, published by Prentice Hall, 1995, "Advanced Digital Communications: Systems and signal processing techniques", edited by Kamilo Feher, published by Prentice Hall, 1987.

Turbo code is a recently discovered class of forward error correcting (FEC) codes that has performance approaching the theoretical limit suggested by the Shannon coding theorem. Turbo code therefore is attractive for high performance communication systems. The theory and design techniques of turbo code can be found in literature. Examples of turbo code literature include the paper "Turbo Codes for PCS Applications" by D. Divsalar and F. Pollara of Jet Propulsion Laboratory, California Institute of Technology, Pasadena, Calif., and U.S. Pat. No. 5,446,747 issued to Berrou.

However, the implementation of turbo code in an integrated modem environment presents a number of challenges. First, the code should operate with different waveforms having different types of modulation and different data rates. Second, the implementation should be compatible with the existing code word such as the Reed-Solomon code for various modes. Third, the implementation should be compatible with standard clock rate used in the system. Fourth, the amount of hardware including interleaving buffers should be reasonable.

Accordingly, there is a need in the technology to provide a flexible and efficient technique to implement an encoder and decoder using the turbo code in an integrated modem system.

SUMMARY

The present invention is a method and apparatus for encoding and decoding a turbo code. In the encoder, an interleaver interleaves and delays a block of input bits to generate interleaved input bits and delayed input bits. A first encoder generates a first, second, and third encoded bits. A second encoder generates a fourth encoded bit. A symbol generator generates a plurality of symbols which correspond to the input bits. In a decoder, a sync search engine detects a synchronizing pattern and extracts symbols from the encoded bits. An input buffer is coupled to the sync search engine to store the extracted symbols. A first soft-in-soft-out (SISO1) is coupled to the input buffer to generate a first soft decision set based on the extracted symbols. An interleaver is coupled to the SISO1 to interleave the first soft decision set. A second soft-in-soft-out (SISO2) is coupled to the input buffer and the interleaver to generate a second soft decision set. A de-interleaver is coupled to the SISO2 to de-interleave the second soft decision set. An adder is coupled to the SISO1 and the de-interleaver to generate a hard decision set.

BRIEF DESCRIPTION OF THE DRAWINGS

The objects, features and advantages of the present invention will become apparent from the following detailed description of the present invention in which:

FIGS. 3A and 3B are portions of a diagram illustrating the turbo code code-table according to a preferred embodiment of the invention.

FIG. 11 shows the synchronization pattern as 40 I/Q pairs according to a preferred embodiment of the invention.

DESCRIPTION OF THE PRESENT INVENTION

The present invention discloses a method and apparatus for an encoder and decoder for the turbo code used in a universal modem system.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

Theory of Operation

Figure 1:
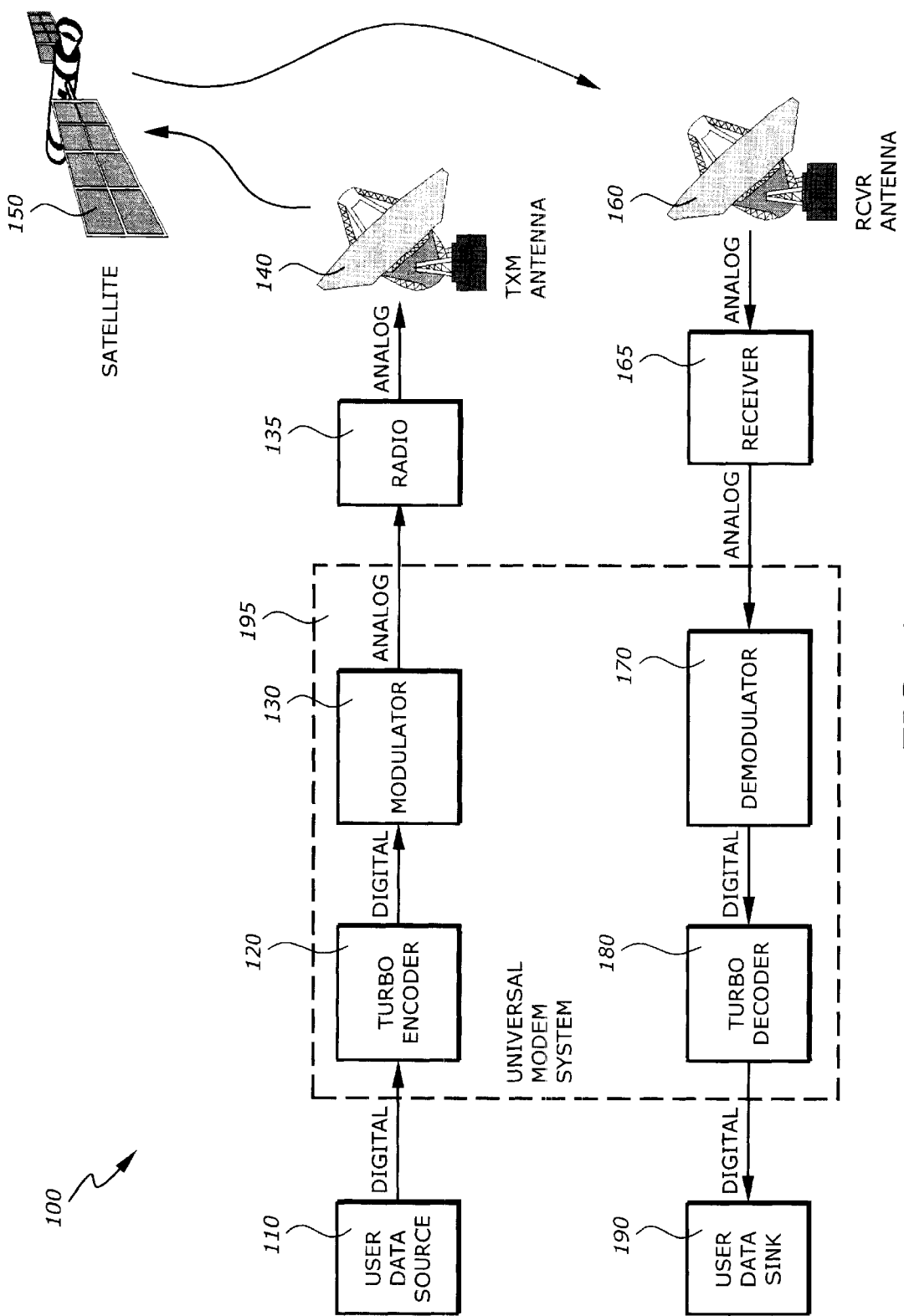
FIG. 1 is a diagram illustration of a system according to a preferred embodiment of the present invention.

FIG. 1 is a diagram illustration of a system 100 according to a preferred embodiment of the present invention. The system 100 includes a user data source 110, a turbo encoder 120, a modulator 130, a radio transmitter 135, a transmitter antenna 140, a satellite 150, a receiver antenna 160, a receiver 165, a demodulator 170, a turbo decoder 180, and a user data sink 190.

The user data source 110 is any communication device that generates digital data to be transmitted. The turbo encoder 120 encodes the digital data generated by the user data source 110 using the turbo code. The modulator 130 receives the encoded data from the turbo encoder 120 and generates an analog signal representing the modulated data. The radio transmitter 135 receives the analog modulated signal from the modulator 130 and transmits the signal to the satellite 150 via the transmitter antenna 140.

The satellite 150 transmits the received radio signal from the transmitter antenna 140 to the receiver antenna 160. The receiver 165 receives the satellite signal via the receiver antenna 160. The demodulator 170 demodulates the analog signal from the receiver 165 to digital data at baseband frequency. The turbo decoder 180 decodes the demodulated digital data from the demodulator 170 using the turbo code. The user data sink 190 is any communication device that receives the decoded digital data from the turbo decoder 180.

The turbo encoder 120 and the turbo decoder 180 use the turbo code to encode and decode the data. The turbo encoder 120, turbo decoder 180, the modulator 130, and the demodulator 170 form an integrated modem system. Structurally, the turbo code is a parallel concatenated convolutional code (PCCC). The turbo code is characterized by an encoding scheme involving recursive convolutional codes and interleaving and an iterative decoding scheme.

In the modem system, the turbo code is employed as one of the forward error correcting (FEC) schemes. For performance enhancement, the turbo code replaces the typical rate-1/2, constraint length-7, convolutional code. Turbo encoder/decoder is used in place of a convolutional encoder/Viterbi decoder (CEVD).

The turbo encoder replaces the standard rate 1/2 convolutional encoder. The turbo encoding occurs after the Reed-Solomon (RS) encoding and byte interleaving and before the final bit/symbol interleaving and modulation. The turbo encoder comprises two identical constituent encoders and an interleaver. Each constituent encoder produces a rate-2/3 code, i.e., there are two input bits and three output bits. The code is systematic, meaning that the input bits appear uncovered in the output. Therefore, the 3-bit output of each encoder includes two input bits plus a code bit. The code is recursive, i.e., the code generators have feedback.

The turbo decoder takes the place of a Viterbi decoder after the bit/symbol de-interleaver and before the byte de-interleaver and Reed-Solomon decoder. The turbo decoder comprises two Soft-Input Soft-Output (SISO) decoders, an interleaver/de-interleaver, and an input buffer to hold the received samples while they are being processed.

The turbo decoder uses a modified Maximum A Posteriori (MAP) algorithm, which is sometimes referred to as the BCJR (Bahl, Cocke, Jelinek, Raviv) algorithm. The BCJR algorithm is considerably more complicated than the well-known Viterbi algorithm (VA). However, the turbo code tends to use a shorter constraint length convolutional code than the VA. Therefore, although each BCJR-based SISO module is more complex per trellis state than the VA, it uses a trellis with fewer states. The resulting 16-state decoder is comparable in size to a 64-state Viterbi decoder.

The VA works in the forward direction and produces hard-decision outputs. In contrast, the BCJR algorithm is a block-oriented algorithm which performs maximum-likelihood estimates in both forward and backward directions and produces soft-decision outputs. In addition, the VA decoder operates on the incoming data once as it is received. In contrast, the turbo decoder operates iteratively, taking several passes through the incoming data and refining its estimate each time.

The integrated modem system uses Binary Phase Shift Keying (BPSK), Quadrature Phase Shift Keying (QPSK), and Offset Quadrature Phase Shift Keying (OQPSK) modulation with concatenated coding. Turbo code is a selectable option. Turbo code is used in place of the standard rate-1/2 constraint length-7 convolutional code to improve the bit error rate performance. In a preferred embodiment, the modem uses data rates up to about 20 Million bits per second (Mbps) and also uses an outer Reed-Solomon (RS) code.

The integrated modem system uses the type of turbo code known as parallel concatenated convolutional code (PCCC). The turbo code employed is a 16-state rate-2/3 PCCC.

Interleaver/De-interleaver

The interleaver in a PCCC provides an interleaver gain approximately proportional to the RS codeword size N for high Eb/No. In addition, to improve performance in terms of BER, the interleaver uses an S-random approach to decorrelate the input data.

The S-random permutation approach generates a sequence of random integers (i, 1, . . . N) without replacement. The S random permutation is defined as follows: each randomly selected integer is compared with the S previously selected integers. If the current selection is equal to any of the S previous selections within a distance of +/−S, then the current selection is rejected. This process is repeated until all N integers are selected. In a preferred embodiment, S is selected to be less than sqrt (N/2), where sqrt(X) is the square root of X. In another embodiment, S is selected to be approximately 20.

The S-random interleaver can be integrated into the turbo encoder/decoder as either block or convolutional structure. Convolutional S-random interleaving allows for continuous processing, but requires large memory storage for the iterative decoding process. In a preferred embodiment, the block type S-random interleaving is used.

Frame Synchronization

In certain communications networks, no additional frame synchronization is needed because the network has timing information embedded in a time-division-multiple-access (TDMA) waveform. Synchronization of the turbo code block uses this timing information. In a preferred embodiment, there are 960 data chips (or QPSK symbols) for each turbo code block.

In other networks, explicit frame synchronization is needed because no timing information is available. To achieve frame synchronization, the sync word is inserted to the data stream after encoding. Then a correlator at the receiving end looks for the sync word. When the sync word is found and located, the block boundaries are immediately set to the correct position relative to the location of the sync word. In a preferred embodiment, an 80-bit sync word is inserted every Nsync (e.g., 5) turbo code blocks. This sync insertion is sufficient to provide a reasonable probability of detection ($P_d$) of 0.9992 and probability of false alarm ($P_{fa}$) of 0.004. In a preferred embodiment, the insertion period is programmable to allow adjustment of the detection and false alarm rates.

Decoder

Acquiring synchronization by a decoder: The turbo decoder has a detachable sync word detection which functions to locate the sync word and set the block boundaries to the correct position. The sync word detection provides phase information to correct the 4-way phase ambiguity before data enters the decoder. The sync word is detected by comparing the sign bit of the received symbols against the known codeword pattern. The score is the number of places in which the received symbol signs match the codeword bits. A hit is declared if the score exceeds a programmable threshold. For added flexibility, the number of consecutive hits before synchronization is declared is made programmable. After synchronization is acquired, the turbo decoding operation begins.

To maintain synchronization, the turbo decoder continues the sync word detection and verification process at block boundaries derived from the declared sync instance. In addition, a window averaging circuit is used to monitor the extrinsic information quality. The window length of the averager is programmable.

SISO module: The SISO module can be implemented using the maximum a posteriori (MAP) algorithm or the soft output Viterbi algorithm (SOVA). The SOVA is simpler but is a little inferior to the MAP algorithm. In a preferred embodiment, the MAP algorithm is used. The SISO module can be implemented using a full block BCJR or a sliding window group (SWG) approach. In a preferred embodiment, the SWG approach is used.

Figures 2A, 2B:
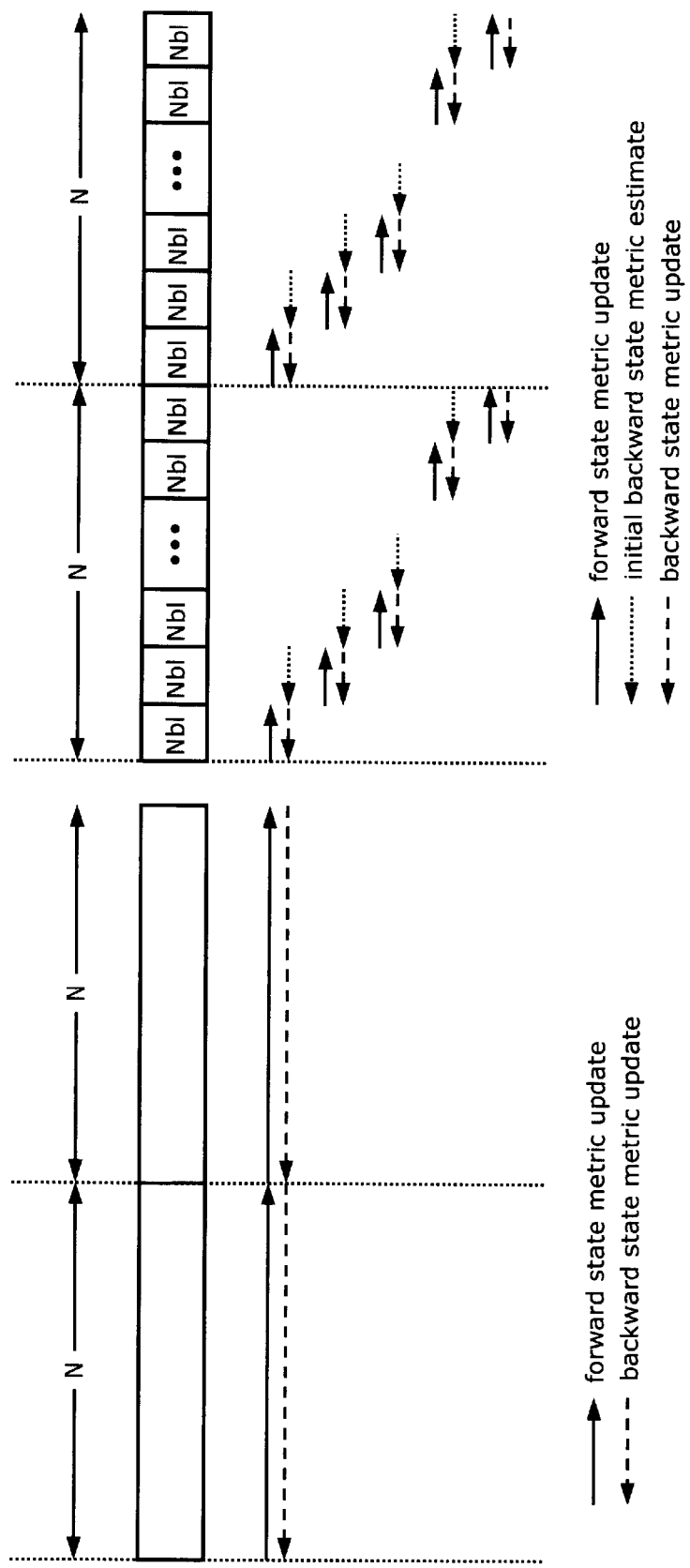
FIG. 2A is a diagram illustrating a full block BCJR implementation for the SISO module according to a preferred embodiment of the present invention.
FIG. 2B is a diagram illustrating a sliding window group (SWG) implementation for the SISO module according to a preferred embodiment of the present invention.

FIG. 2A is a diagram illustrating a full block BCJR implementation for the SISO module according to a preferred embodiment of the present invention. In the full block BCJR implementation, the entire N time steps are processed in both forward and backward state metric updates.

FIG. 2B is a diagram illustrating a sliding window group (SWG) implementation for the SISO module according to a preferred embodiment of the present invention. With the SWG implementation, the N time steps of the full turbo code block are divided into smaller groups of Nbl time steps for both forward and backward state metric updates. In a preferred embodiment, NBl is chosen such that N is an integer multiple of Nbl.

In a preferred embodiment, trellis termination is not implemented to reduce hardware complexity.

The dynamics of a time-invariant convolutional code are completely specified by a single trellis section, which describes the transitions (edges) between the states of the trellis at time instants k and k+1. A trellis section is characterized by the following:

(1) A set of M states S=f{s1, . . . , sM} The state of the trellis at time k is Sk=s, with s∈S.

(2) A set of M×$M_I$, edges obtained by the Cartesian product of the set of states S and the set of input symbols U:
   E=S×U=f{$e_1$, . . . , $e_{M \times MI}$} which represents all possible transitions between the trellis states.

For the turbo code, the number of states, M, equals to 16. Given the rate-2/3 constituent code, the number of transitions connecting states between time instant k to k+1 is 16×4=64.

FIGS. 3A and 3B are portions of a diagram illustrating the turbo code code-table according to a preferred embodiment of the invention. FIGS. 3A and 3B tabulate trellis, state, and output information of the constituent convolutional code. The current encoder state is CS, {m0, m2, m1, m3}. The next encoder state is NS, {m0', m2', m1', m3'}. The input bits are u1 and u2. The non-symmetric coded bit is c. FIGS. 3A and 3B specify all edge and trellis information for the turbo code.

Figure 3C:
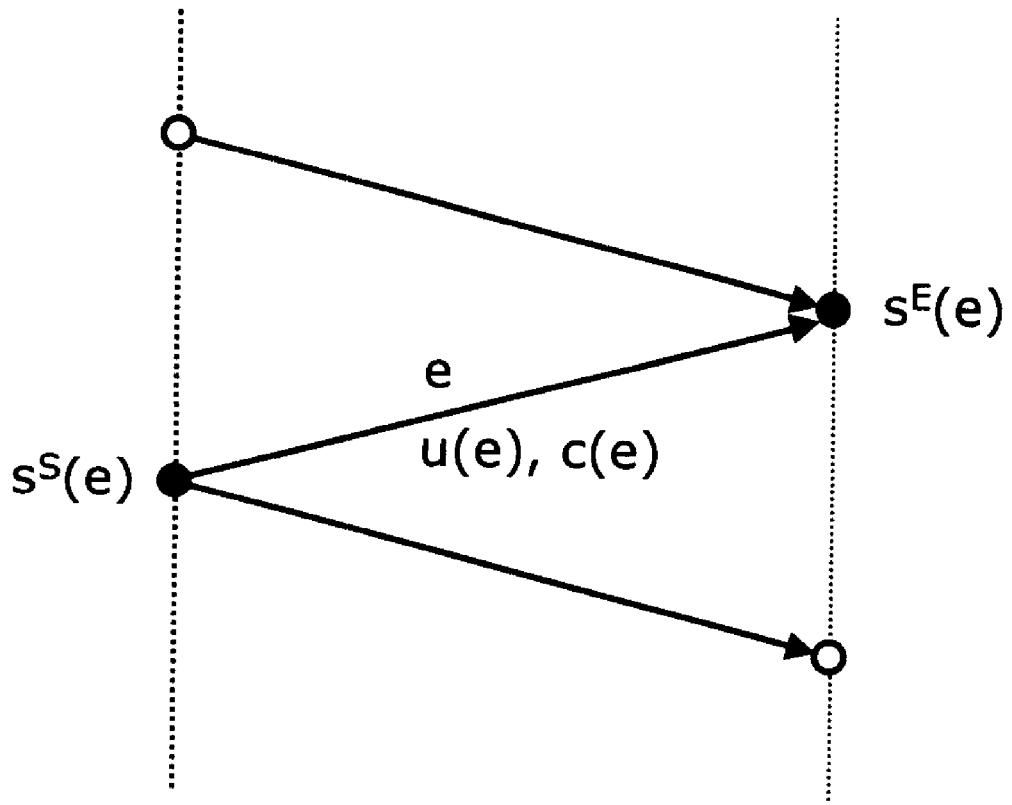
FIG. 3C is a diagram illustrating an edge definition of a trellis section according to a preferred embodiment of the invention.

FIG. 3C is a diagram illustrating an edge definition of a trellis section according to a preferred embodiment of the invention.

The following functions are associated with each edge e∈E:

(1) The starting state $s^S(e)$ (current state CS in FIG. 3A).

(2) The ending state $s^E(e)$ (next state NS in FIG. 3A).

(3) The input symbol u(e).

(4) The output symbol c(e).

The relationship between these functions depends on the particular encoder. As an example, in the case of systematic encoders, ($s^S(e)$; $c(e)$) also identifies the edge since $u(e)$ is uniquely determined by $c(e)$. In the following, the pair ($s^S e$); $u(e)$) uniquely identifies the ending state $s^E(e)$; this assumption is always verified, as it is equivalent to say that, given the initial trellis state, there is a one-to-one correspondence between input sequences and state sequences, a property required for the code to be uniquely decodable.

SISO Module

Each SISO module performs the following processing functions: branch metric generation, forward state metric update, backward state metric update, and extrinsic information calculation.

Both the forward and backward state metric update calculations utilize an add-compare-select (ACS) function with correction and are similar to the normal forward state metric update of the Viterbi algorithm.

Given time instance $k \in [1, \ldots, n]$ where n is the number of time instance per turbo code block, and a rate-p1/q1 constituent code, i.e., p1 information bits produce q1 encoded bits, the output extrinsic information is calculated as followed:

$$\lambda_k(U_{k,j}; 0) =$$

$$\min_{e:u_{k,j}(e)=1}^* \left\{ \alpha_{k-1}[s^S(e)] + \sum_{\substack{i=1\\i \neq j}}^{p1} u_{k,i(e)}\lambda_k[U_{k,i}; I] + \sum_{i=1}^{q1} c_{k,i(e)}\lambda_k[c_{k,i}; I] + \beta_k[s^E(e)] \right\} \min_{e:u_{k,j}(e)=0}^* \left\{ \alpha_{k-1}[s^S(e)] + \sum_{\substack{i=1\\i \neq j}}^{p1} u_{k,i(e)}\lambda_k[U_{k,i}; I] + \sum_{i=1}^{q1} c_{k,i(e)}\lambda_k[c_{k,i}; I] + \beta_k[s^E(e)] \right\}$$

where $$\alpha_k(s) = \min_{e:s^E(e)=s}^* \left\{ \alpha_{k-1}[s^s(e)] + \sum_{i=1}^{p1} u_{k,i}(e)\lambda_k[U_{k,i}; I] + \sum_{i=1}^{q1} c_{k,i}(e)\lambda_k[c_{k,i}; I] + \beta_k[s^E(e)] \right\}$$

is the forward recursion calculation, and $$\beta_k(s) = \min_{e:s^E(e)=s}^* \left\{ \beta_{k+1}[s^s(e)] + \sum_{i=1}^{p1} u_{k+1,i}(e)\lambda_{k+1}[U_{k+1,i}; I] + \sum_{i=1}^{q1} c_{k+1,i}(e)\lambda_{k+1}[c_{k+1,i}; I] + h_{\beta_k} \right\}$$

is the backward recursion calculation, $\alpha_k(s)$ is the forward state metric of state s at time step k,
$\beta_k(s)$ is the backward state metric of state s at time step k,
$\lambda_k[c_{k,i}; I]$ is demodulator soft decision associated with encoded bit I at time step k,
$\lambda_k[U_{k,i}; I]$ is input extrinsic information associated with information bit I at time step k,
$h_{\alpha_k}, h_{\beta_k}$ are normalization constants, min* { } is the compare-and-select function, with minor correction.

The min*(a0, a1) function is implemented as followed: min*(a0, a1)=min(a0, a1)+LUT( |a0−a1|), where LUT is a table lookup function and the table has 16 entries as defined in Table 1.

TABLE 1

Lookup Table for Min* Function

| |a0-a1| | LUT(|a0-a1|) |
|---|---|
| 0 | 5 |
| 1 | 4 |
| 2 | 4 |
| 3 | 3 |
| 4 | 3 |
| 5 | 2 |
| 6 | 2 |
| 7 | 2 |
| 8 | 2 |
| 9 | 1 |
| 10 | 1 |
| 11 | 1 |
| 12 | 1 |
| 13 | 1 |
| 14 | 1 |
| 15 | 1 |
| ≥16 | 0 |

For min*(a0, a1, a2, a3, . . . ) with more than two arguments, min*( ) can be implemented as min*(a0, a1, a2, a3)=min*[min*(a0, a1), min*(a2, a3)], or min*(a0, a1, a2, a3)=min*{min*[min*(a0, a1), a2)], a3}. In order to improve hardware timing margin, the former approach is used.

In theory $\alpha_k(s)$ and $\beta_k(s)$ are initialized using:

$\alpha_o(s)=0$ if s=0 (initial zero state) and $\alpha_o(s)=\infty$ otherwise.

$\beta_n(s)=\infty$ or 0 for all s (unknown end state).

For the turbo decoder hardware implementation, $\alpha_k(s)$ and $\beta_k(s)$ however are initialized as followed:

$\alpha_o(s)=-96$ if s=0 (initial zero state) and $\alpha_o(s)=127$ otherwise.

$\beta_n(s)=0$ for all s (unknown end state).

This hardware constraint is due to the fact that all $\alpha_k(s)$ and $\beta_k(s)$ are stored as 8-bit 2's complement values to save memory storage. This restricts the values of $\alpha_k(s)$ and $\beta_k(s)$ to [−128, . . . , 127]. The setting of $\alpha_o(0)=-96$, rather than −128, provides sufficient underflow protection that eliminates the need to check for underflow and the associated clamping function.

Branch Metric Generation

For the turbo decoder, there are five inputs: $\pi(c_{1;I})$, $\pi(c_{2;I})$, $\pi(c_{3;I})$ [7-bit 2's complement values], $\pi(u_{1;I})$, and $\pi(u_{2;I})$ [6-bit 2's complement values] for each SISO module. Branch metrics are generated as follows:

The 2's complement input values are converted to sign-magnitude representation for ease of hardware implementation. If the input matches the hypothesis associated with the bit, branch metric for that bit is set to zero. Negative input matches '1' hypothesis and non-negative input matches '0' hypothesis. Otherwise, branch metric for that bit is set to the absolute value of the input.

Table 2 shows the sample branch metric calculation for input values $\{\pi(c_{1;I}), \pi(c_{2;I}), \pi(c_{3;I})\}=\{10, -15, 23\}$ and $\{\pi(u_{1;I}), (u_{2;I})\}=\{35, -54\}$, and the forward transitions from state i to state 0 in one time step and the associated branch metrics (BM).

TABLE 2

Sample Branch Metric Calculation

| $s^S(e)$ | $s^E(e)$ | u1 | u2 | c1 | c2 | c3 | BMu1 | BMu2 | BMc1 | BMc2 | BMc3 |
|---|---|---|---|---|---|---|---|---|---|---|---|
| 0 | 0 | 0 | 0 | 0 | 0 | 0 | 0 | 54 | 0 | 15 | 0 |
| 1 | 0 | 0 | 1 | 0 | 1 | 1 | 0 | 0 | 0 | 0 | 23 |
| 3 | 0 | 1 | 0 | 1 | 0 | 1 | 35 | 54 | 10 | 15 | 23 |
| 2 | 0 | 1 | 1 | 1 | 1 | 0 | 35 | 0 | 10 | 0 | 0 |

Forward State Metric Update

For the turbo decoder, at each time step k, there are 16 forward state metrics to be updated using the branch metrics calculated for inputs at time step k and the 16 forward state metrics calculated and stored at time k−1.

The forward state metric updates are calculated as followed:

$$\alpha_k(s) = \min_{e:s^E(e)=s}^* \left\{ \alpha_{k-1}[s^S(e)] + \sum_{i=1}^{2} u_{k,i(e)} \lambda_k[U_{k,1}; I] + \sum_{i=1}^{3} c_{k,i}(e) \lambda_k[c_{k,i}; I] + h_{\alpha_k} \right\}$$

Given the rate-2/3 constituent code with two information bits and three coded bits, there are four previous states and hence four edges associated with each specific current state.

Figure 4:
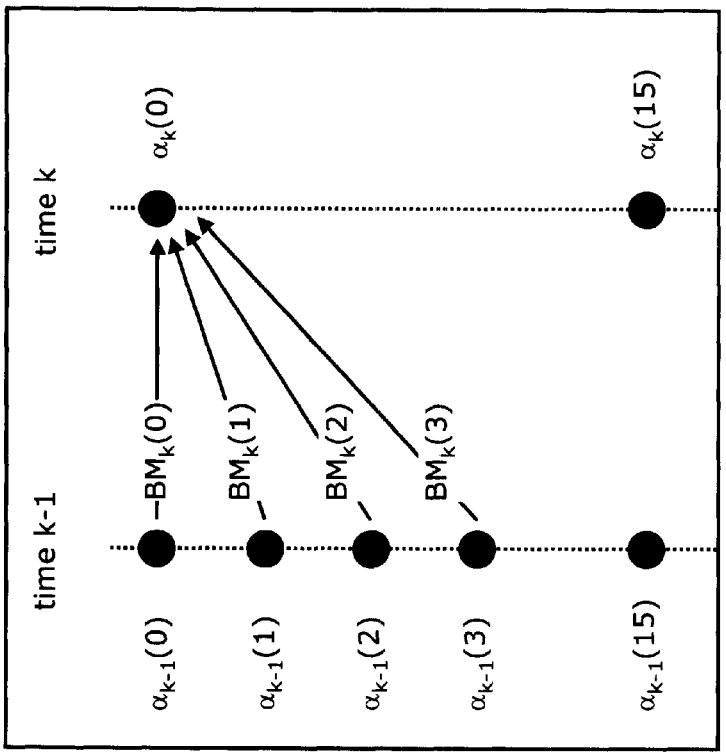
FIG. 4 is a diagram illustrating a sample forward state metric update according to a preferred embodiment of the present invention.

FIG. 4 is a diagram illustrating a sample forward state metric update according to a preferred embodiment of the present invention. FIG. 4 shows the transitions obtained by continuing with the above example, using the 0 state for the specific current state $s^E(e)$.

Table 3 shows sample forward state metric update calculations using the old forward state metrics: $\alpha_{k-1}(0)=0$, $\alpha_{k-1}(1)=127$, $\alpha_{k-1}(3)=50$, and $\alpha_{k-1}(2)=200$.

will be made. The renormalization flag is set for the next set of forward state metric calculation if all newly updated forward state metrics exceed the threshold, currently set to 16. The sixteen forward state metrics are further tested for overflow and clamped to 127 if overflow before they are stored into the RAM for processing at the next time step.

Backward State Metric Update

For the turbo decoder, at each time step k, there are 16 backward state metrics to be updated using the branch metrics calculated for inputs at time step k and the 16 backward state metrics calculated and stored at time k+1.

The backward state metric updates are calculated as followed:

$$\beta_k(s) = \min_{e:s^S(e)=s}^* \left\{ \beta_{k+1}[s^e(e)] + \sum_{i=1}^{2} u_{k+1,i(e)} \lambda_{k+1}[U_{k+1,i}; I] + h_{\beta_k} \right\}$$

and is very similar to the forward state metric update calculation.

TABLE 3

Sample Forward State Metric Update Calculation

| $s^S(e)$ | $s^E(e)$ | u1 | u2 | c1 | c2 | c3 | BMu1 | BMu2 | BMc1 | BMc2 | BMc3 | $\alpha_{k-1}((s^S(e)))$ | $\alpha_{k-1}((s^S(e))) + BM$ |
|---|---|---|---|---|---|---|---|---|---|---|---|---|---|
| 0 | 0 | 0 | 0 | 0 | 0 | 0 | 0 | 54 | 0 | 15 | 0 | 0 | 69 |
| 1 | 0 | 0 | 1 | 0 | 1 | 1 | 0 | 0 | 0 | 0 | 23 | 127 | 150 |
| 3 | 0 | 1 | 0 | 1 | 0 | 1 | 35 | 54 | 10 | 15 | 23 | 50 | 187 |
| 2 | 0 | 1 | 1 | 1 | 1 | 0 | 35 | 0 | 10 | 0 | 0 | 200 | 245 |

$\alpha_k(0)=\min^*(69, 150, 187, 245)$ which is calculated as $\alpha_k(0)=\min^*[\min^*(69, 150), \min^*(187, 245),]=\min^*[69, 187]=69$.

For each time step k, all sixteen forward state metrics $\alpha_k(s)$ are updated as above and stored. Each $\alpha_k(s)$ is stored as an 8-bit 2's complement number.

Figure 5:
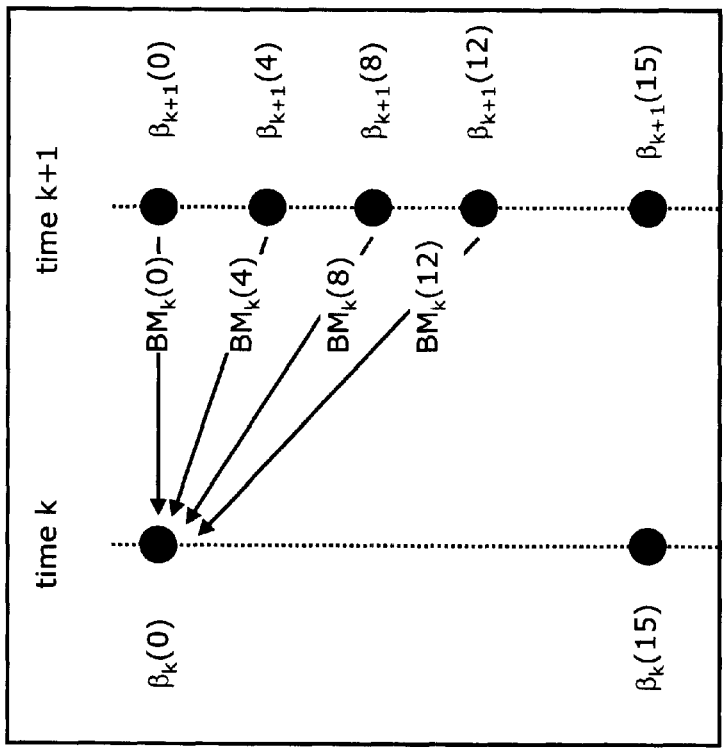
FIG. 5 is a diagram illustrating a sample backward state metric update according to a preferred embodiment of the present invention.

Given the 8-bit storage constraint, renormalization is required to prevent overflow. A renormalization flag is used for that purpose. If the renormalization flag is set, $\alpha_k(s)=\alpha_k(s)$—threshold for all sixteen $\alpha_k(s)$; otherwise, no change FIG. 5 is a diagram illustrating a sample backward state metric update according to a preferred embodiment of the present invention. FIG. 5 shows that there are four next states and hence four edges associated with each specific current state, given the rate-2/3 constituent code with two information bits and three coded bits.

Table 4 shows sample forward state metric update calculations using the input values $\{\pi(c_1; I), \pi(c2; I), \pi(c_3; I)\}=\{10, -15, 23\}$, $\{\pi(u_1; I), \pi(u2; I)\}=\{35, 54\}$ at time step k, and the old backward state metrics.

TABLE 4

Sample Forward State Metric Update Calculation

| $s^S(e)$ | $s^E(e)$ | u1 | u2 | c1 | c2 | c3 | BMu1 | BMu2 | BMc1 | BMc2 | BMc3 | $\beta_k\,(s^S(ee))$ | $\beta_k\,((s^S(ee)) + BM$ |
|---|---|---|---|---|---|---|---|---|---|---|---|---|---|
| 0 | 0 | 0 | 0 | 0 | 0 | 0 | 0 | 54 | 0 | 15 | 0 | 150 | 219 |
| 0 | 4 | 0 | 1 | 0 | 1 | 1 | 0 | 0 | 0 | 0 | 23 | 50 | 78 |
| 0 | 8 | 1 | 0 | 1 | 0 | 1 | 35 | 54 | 10 | 15 | 23 | 200 | 337 |
| 0 | 12 | 1 | 1 | 1 | 1 | 0 | 35 | 0 | 10 | 0 | 0 | 100 | 145 |

$\beta_{k-1}(0)=\min^*(219, 78, 337, 145)$ which is calculated as $\beta_{k-1}(0)=\min^*[\min^*(219, 78), \min^*(337, 145)]=\min^*[78, 145]=78$.

The backward state metric update hardware uses identical renormalization and clamping scheme as the forward state metric update hardware.

Extrinsic Information Calculation

The output extrinsic information is generated as followed:

$$\lambda_k(U_{k,j};0) =$$

$$\min_{e:u_{k,j}(e)=1}^* \left\{ \alpha_{k-1}[s^S(e)] + \sum_{\substack{i=1 \\ i\neq j}}^{2} u_{k,i(e)}\lambda_k[U_{k,i};I] + \sum_{i=1}^{3} c_{k,i(e)}\lambda_k[C_{k,i};I] + \right.$$

$$\left. \beta_k[S^E(e)] \right\} - \min_{e:u_{k,j}(e)=0}^* \left\{ \alpha_{k-1}[s^S(e)] + \right.$$

$$\left. \sum_{\substack{i=1 \\ i\neq j}}^{2} u_{k,i(e)}\lambda_k[U_{k,i};I] + \sum_{i=1}^{3} c_{k,i(e)}\lambda_k[c_{k,i};I] + \beta_k[S^E(e)] \right\}$$

Figure 6:
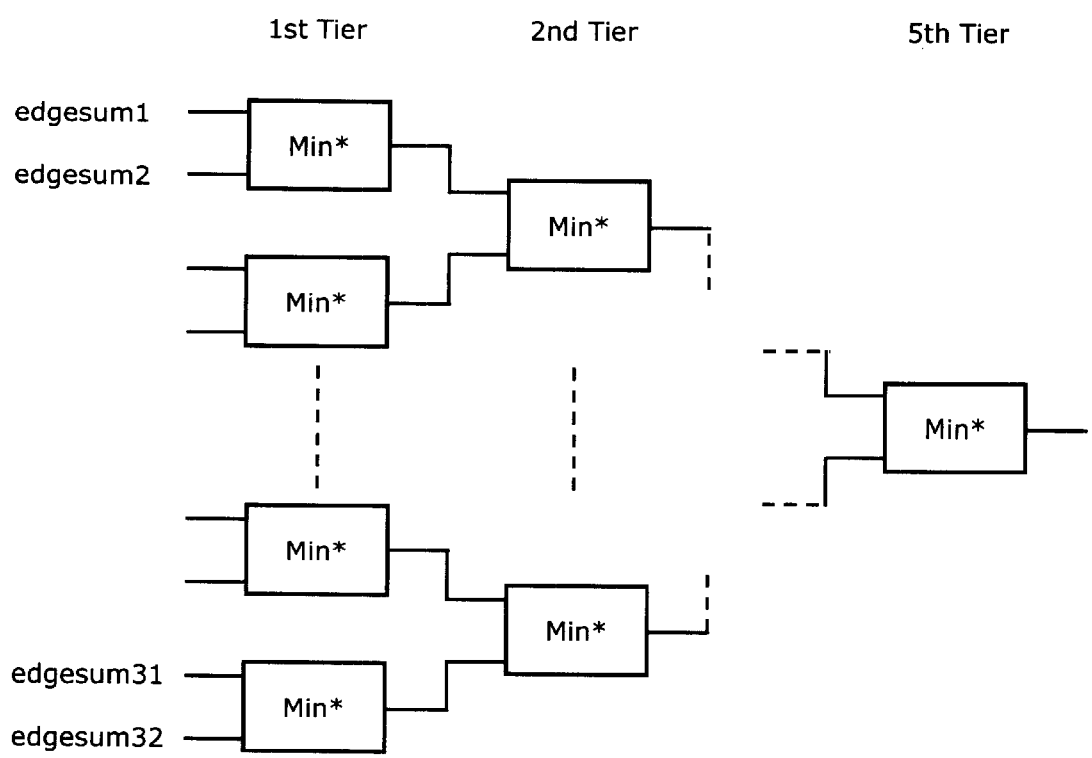
FIG. 6 is a diagram illustrating a Min* tree structure for the extrinsic information calculations according to a preferred embodiment of the present invention.

FIG. 6 is a diagram illustrating a Min* tree structure for the extrinsic information calculations according to a preferred embodiment of the present invention. For the turbo decoder, each min* { } in the above equation has 32 arguments and requires five-tier two-argument min*( ) tree structure.

Tables 5, 6, 7 and 8 show sample calculations for same exemplary values of u1 and u2. Table 5 shows calculations for u1=0, 32 arguments (edgesums) are calculated. Table 6 shows calculations for u1=1. The output extrinsic information for u1 is obtained by taking the difference between the $\min^*\{\ \}|_{u/=1}$ and $\min^*\{\ \}|_{u/=0}$.

Using input values $\{\pi(u_1;I),\pi(u2;I)=35, -54\}$ and $\pi(c_1;I),\pi(c2;I),\pi(c3;I)\}=\{10, -15, 23\}$ at time step k, and using the $\alpha_{k-1}(0)=0$, $\alpha_{k-1}(1)=127$, $\alpha_{k-1}(3)=50$, and $\alpha_{k-1}(2)=200$, and $\beta_k(0)+BM(k)=219$, $\beta_k(4)+BM(k)=78$, $\beta_k(8)+BM(k)=337$, and $\beta_k(12)+BM(k)=145$.

Tables 5 and 6 have a few entries to show sample calculations.

Extrinsic information is clamped to 7-bit 2's complement value before storage.

TABLE 5

Sample Edgesum Calculation for u1 = 0

| i | $s^S(e)$ | $s^E(e)$ | $\alpha_{k-1}^{(s^S(e))}$ | $\beta_k((s^S(e))+BM(k))$ | $BM_{u1}$ | Edgesum(i) = $\alpha(s^s(e)) + [\beta(s^E(e)) + BM(k)] - BM_{u1}$ |
|---|---|---|---|---|---|---|
| 0 | 0 | 0 | 0 | 219 | 0 | 219 |
| 1 | 1 | 4 | 127 | 78 | 0 | 205 |
| 2 | 2 | 12 | 200 | 145 | 0 | 345 |
| 3 | 3 | 8 | 50 | 337 | 0 | 387 |
| 4 | 4 | 13 | | | 0 | |
| 5 | 5 | 9 | | | 0 | |
| 6 | 6 | 1 | | | 0 | |
| 7 | 7 | 5 | | | 0 | |
| 8 | 8 | 2 | | | 0 | |
| 9 | 9 | 6 | | | 0 | |
| 10 | 10 | 14 | | | 0 | |
| 11 | 11 | 10 | | | 0 | |
| 12 | 12 | 15 | | | 0 | |
| 13 | 13 | 11 | | | 0 | |
| 14 | 14 | 3 | | | 0 | |
| 15 | 15 | 7 | | | 0 | |
| 16 | 0 | 4 | 0 | 78 | 0 | 78 |
| 17 | 1 | 0 | 127 | 219 | 0 | 346 |
| 18 | 2 | 8 | 200 | 337 | 0 | 537 |
| 19 | 3 | 12 | 50 | 145 | 0 | 195 |
| 20 | 4 | 9 | | | 0 | |
| 21 | 5 | 13 | | | 0 | |
| 22 | 6 | 5 | | | 0 | |
| 23 | 7 | 1 | | | 0 | |
| 24 | 8 | 6 | | | 0 | |
| 25 | 9 | 2 | | | 0 | |
| 26 | 10 | 10 | | | 0 | |
| 27 | 11 | 14 | | | 0 | |
| 28 | 12 | 11 | | | 0 | |
| 29 | 13 | 15 | | | 0 | |
| 30 | 14 | 7 | | | 0 | |
| 31 | 15 | 3 | | | 0 | |

TABLE 6

Sample Edgesum Calculation for u1 = 1

| i | $s^S(e)$ | $s^E(e)$ | $\alpha_{k-1}(s^S(e))$ | $\beta_k((s^S(e)) + BM(k))$ | $BM^{u1}$ | Edgesum(i) = $\alpha(s^S(e)) + [\beta(s^E(e)) + BM(k)] - BM_{u1}$ |
|---|---|---|---|---|---|---|
| 0 | 0 | 8 | 0 | 337 | 35 | 302 |
| 1 | 1 | 12 | 127 | 145 | 35 | 237 |
| 2 | 2 | 4 | 200 | 78 | 35 | 243 |
| 3 | 3 | 0 | 50 | 219 | 35 | 234 |
| 4 | 4 | 5 | | | 35 | |
| 5 | 5 | 1 | | | 35 | |
| 6 | 6 | 9 | | | 35 | |
| 7 | 7 | 13 | | | 35 | |
| 8 | 8 | 10 | | | 35 | |
| 9 | 9 | 14 | | | 35 | |
| 10 | 10 | 6 | | | 35 | |
| 11 | 11 | 2 | | | 35 | |
| 12 | 12 | 7 | | | 35 | |
| 13 | 13 | 3 | | | 35 | |
| 14 | 14 | 11 | | | 35 | |
| 15 | 15 | 15 | | | 35 | |
| 16 | 0 | 12 | 0 | 145 | 35 | 110 |
| 17 | 1 | 8 | 127 | 337 | 35 | 429 |
| 18 | 2 | 0 | 200 | 219 | 35 | 384 |
| 19 | 3 | 4 | 50 | 78 | 35 | 93 |
| 20 | 4 | 1 | | | 35 | |
| 21 | 5 | 5 | | | 35 | |
| 22 | 6 | 13 | | | 35 | |
| 23 | 7 | 9 | | | 35 | |
| 24 | 8 | 14 | | | 35 | |
| 25 | 9 | 10 | | | 35 | |
| 26 | 10 | 2 | | | 35 | |
| 27 | 11 | 6 | | | 35 | |
| 28 | 12 | 3 | | | 35 | |
| 29 | 13 | 7 | | | 35 | |
| 30 | 14 | 15 | | | 35 | |
| 31 | 15 | 11 | | | 35 | |

TABLE 7

Sample Edgesum Calculation for u2 = 0

| i | $s^S(e)$ | $s^E(e)$ | $\alpha_{k-1}(s^S(e))$ | $\beta_k((s^S(e)) + BM(k))$ | $BM_{u2}$ | Edgesum(i) = $\alpha(s^S(e)) + [\beta(s^E(e)) + BM(k)] - BM_{u2}$ |
|---|---|---|---|---|---|---|
| 0 | 0 | 0 | 0 | 219 | 54 | 165 |
| 1 | 1 | 4 | 127 | 78 | 54 | 151 |
| 2 | 2 | 12 | 200 | 145 | 54 | 291 |
| 3 | 3 | 8 | 50 | 337 | 54 | 333 |
| 4 | 4 | 13 | | | 54 | |
| 5 | 5 | 9 | | | 54 | |
| 6 | 6 | 1 | | | 54 | |
| 7 | 7 | 5 | | | 54 | |
| 8 | 8 | 2 | | | 54 | |
| 9 | 9 | 6 | | | 54 | |
| 10 | 10 | 14 | | | 54 | |
| 11 | 11 | 10 | | | 54 | |
| 12 | 12 | 15 | | | 54 | |
| 13 | 13 | 11 | | | 54 | |
| 14 | 14 | 3 | | | 54 | |
| 15 | 15 | 7 | | | 54 | |
| 16 | 0 | 8 | 0 | 337 | 54 | 283 |
| 17 | 1 | 12 | 127 | 145 | 54 | 218 |
| 18 | 2 | 4 | 200 | 78 | 54 | 224 |
| 19 | 3 | 0 | 50 | 219 | 54 | 215 |
| 20 | 4 | 5 | | | 54 | |
| 21 | 5 | 1 | | | 54 | |
| 22 | 6 | 9 | | | 54 | |
| 23 | 7 | 13 | | | 54 | |
| 24 | 8 | 10 | | | 54 | |
| 25 | 9 | 14 | | | 54 | |
| 26 | 10 | 6 | | | 54 | |
| 27 | 11 | 2 | | | 54 | |
| 28 | 12 | 7 | | | 54 | |
| 29 | 13 | 3 | | | 54 | |

TABLE 7-continued

Sample Edgesum Calculation for u2 = 0

| i | $s^S(e)$ | $s^E(e)$ | $\alpha_{k-1}(s^S(e))$ | $\beta_k((s^S(e))+BM(k))$ | $BM_{u2}$ | Edgesum(i) = $\alpha(s^S(e)) + [\beta(s^E(e))+BM(k)] - BM_{u2}$ |
|---|---|---|---|---|---|---|
| 30 | 14 | 11 | | | 54 | |
| 31 | 15 | 15 | | | 54 | |

TABLE 8

Sample Edgesum Calculation for u2 = 1

| i | $s^S(e)$ | $s^E(e)$ | $\alpha_{k-1}(s^S(e))$ | $\beta_k((s^S(e))+BM(k))$ | $BM_{u2}$ | Edgesum(i) = $\alpha(s^S(e)) + [\beta(s^E(e))+BM(k)] - BM_{u2}$ |
|---|---|---|---|---|---|---|
| 0 | 0 | 4 | 0 | 78 | 0 | 78 |
| 1 | 1 | 0 | 127 | 219 | 0 | 346 |
| 2 | 2 | 8 | 200 | 337 | 0 | 537 |
| 3 | 3 | 12 | 50 | 145 | 0 | 195 |
| 4 | 4 | 9 | | | 0 | |
| 5 | 5 | 13 | | | 0 | |
| 6 | 6 | 5 | | | 0 | |
| 7 | 7 | 1 | | | 0 | |
| 8 | 8 | 6 | | | 0 | |
| 9 | 9 | 6 | | | 54 | |
| 10 | 10 | 10 | | | 0 | |
| 11 | 11 | 14 | | | 0 | |
| 12 | 12 | 11 | | | 0 | |
| 13 | 13 | 15 | | | 0 | |
| 14 | 14 | 7 | | | 0 | |
| 15 | 15 | 3 | | | 0 | |
| 16 | 0 | 12 | 0 | 145 | 0 | 145 |
| 17 | 1 | 8 | 127 | 337 | 0 | 464 |
| 18 | 2 | 0 | 200 | 219 | 0 | 419 |
| 19 | 3 | 4 | 50 | 78 | 0 | 128 |
| 20 | 4 | 1 | | | 0 | |
| 21 | 5 | 5 | | | 0 | |
| 22 | 6 | 13 | | | 0 | |
| 23 | 7 | 9 | | | 0 | |
| 24 | 8 | 14 | | | 0 | |
| 25 | 9 | 10 | | | 0 | |
| 26 | 10 | 2 | | | 0 | |
| 27 | 11 | 6 | | | 0 | |
| 28 | 2 | 3 | | | 0 | |
| 29 | 13 | 7 | | | 0 | |
| 30 | 14 | 15 | | | 0 | |
| 31 | 15 | 11 | | | 0 | |

Preferred Embodiment of the Turbo Encoder

Figure 7:
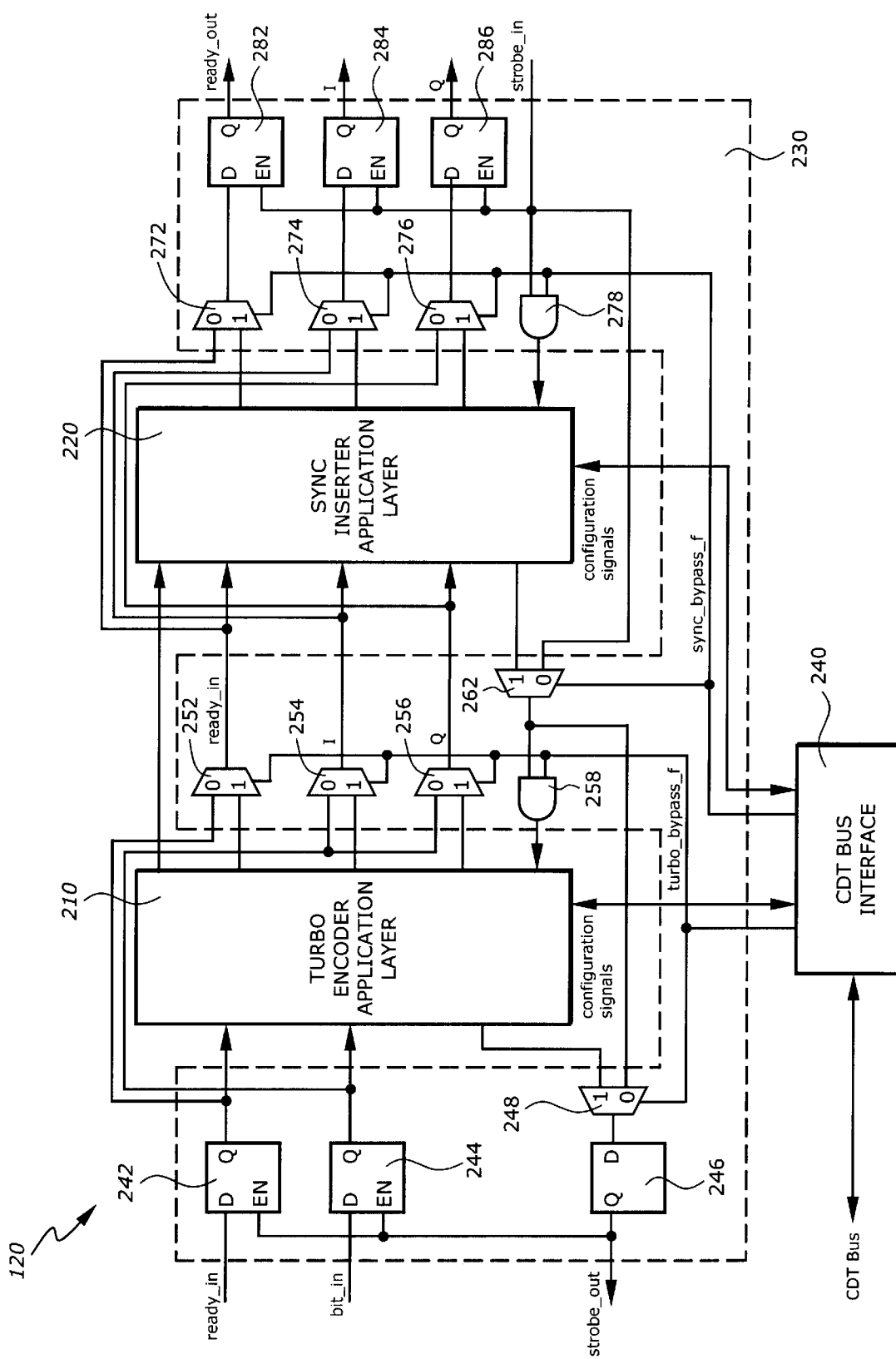
FIG. 7 is a diagram illustrating in detail a turbo encoder shown in FIG. 1 according to a preferred embodiment of the present invention.

FIG. 7 is a diagram illustrating in detail a turbo encoder 120 shown in FIG. 1 according to a preferred embodiment of the present invention. The turbo encoder 120 includes a turbo encoder application layer (TEAL) 210, a sync inserter application layer (SIAL) 220, a latch and routing circuit (LRC) 230, and a control and bus interface circuit 240.

The TEAL 210 receives the latched ready_in and bit_in and strobe_ in signals, and generates In-Phase and Quadrature (I and Q) signals, ready_out and first_bit signals. The TEAL 210 essentially performs the main encoding function. The TEAL 210 will be described in more details later.

The SIAL 220 receives the bit stream as generated by TEAL 210 or the original input signals and inserts the synchronizing pattern to produce the output data stream. The SIAL 220 will be described in more details later.

The latch and routing circuit 230 latches the input, output, and strobe signals, and routes the signals to bypass the TEAL 210 or the SIAL 220. The latch and routing circuit 230 includes D flip-flops 242, 244, 246, 282, 284, and 286, AND gates 258 and 278, two-to-one multiplexers 248, 252, 254, 256, 262, 272, 274, and 276.

The D flip-flops 242 and 244 latches the ready_in and bit_in signals synchronously with the strobe_out signal. The D flip-flop 246 latches the strobe_out signal as generated by the TEAL 210 or the SIAL 220. The multiplexer 248 selects between the strobe_out signal generated by the TEAL 210 and the strobe_out signal generated by the previous stage as provided by the multiplexer 262. The multiplexer 262 selects between the strobe_out signal generated by the SIAL 220 and the strobe_in signal. The multiplexer 252 selects between the latched ready_in signal and the ready signal as generated by the TEAL 210. The multiplexer 254 selects between the latched bit_in signal and the bit_in signal representing the I component as generated by the TEAL 210. The multiplexer 256 selects between the latched bit_in signal and the bit_in signal representing the Q component as generated by the TEAL 210.

The control and bus interface circuit 240 interfaces with the host bus and generates configuration and control signals to the TEAL 210, the SIAL 220, and the latch and routing circuit 230.

Figure 8:
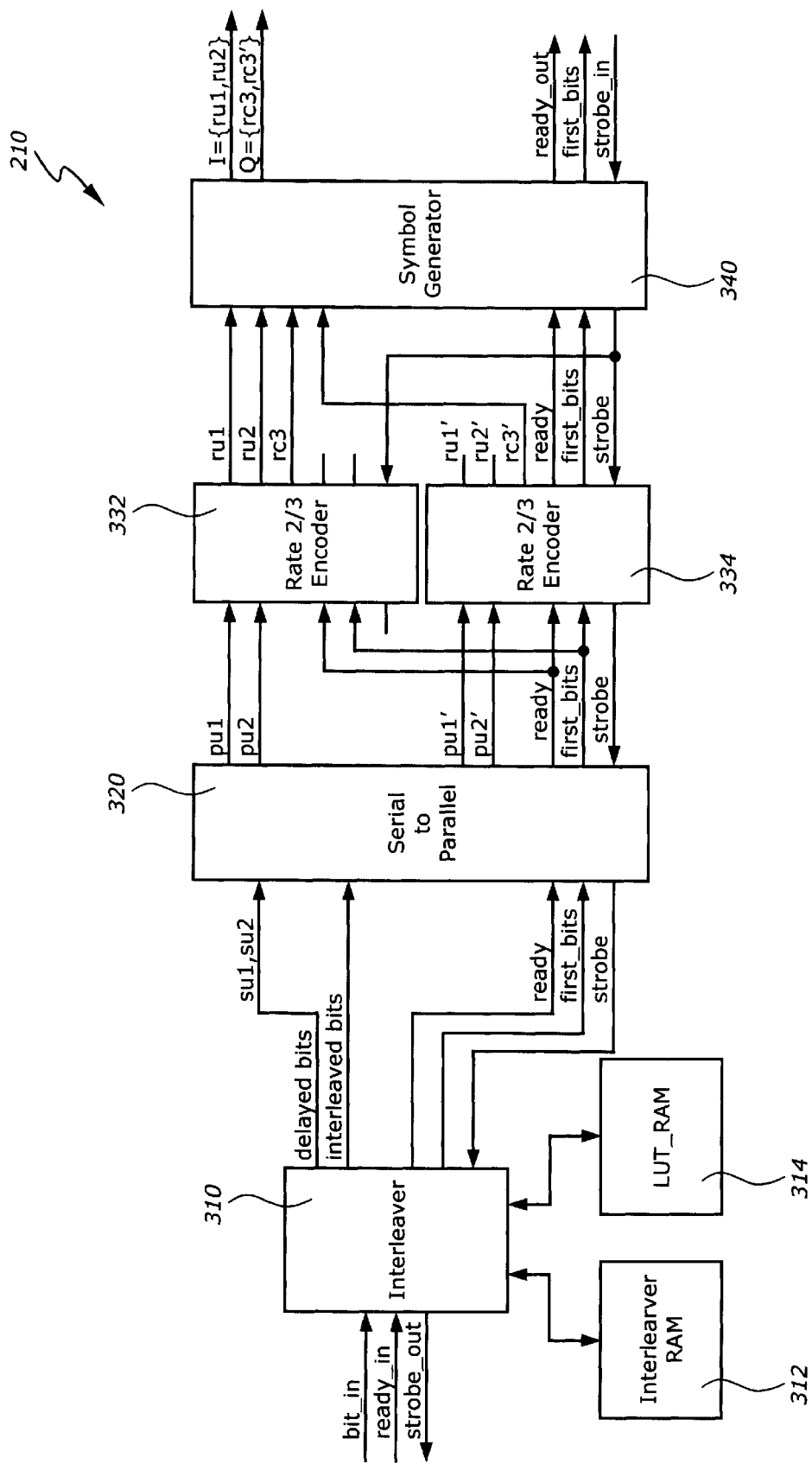
FIG. 8 is a diagram illustrating in detail a turbo encoder application layer (TEAL) shown in FIG. 7 according to a preferred embodiment of the present invention.

FIG. 8 is a diagram illustrating in detail a turbo encoder application layer (TEAL) 210 shown in FIG. 7 according to a preferred embodiment of the present invention. The TEAL 210 includes an interleaver 310, a serial-to-parallel converter 320, a first rate encoder 332, a second rate encoder 334, and a symbol generator 340. The input and output signals of the TEAL 210 are:

Input:
bit_in: serial input bit stream
ready_in: qualifier for bit_in to indicate that bit_in contains valid data.
strobe_in: One clock cycle strobe from the downstream module telling the turbo encoder to update the I, Q, and ready_out signals with new data. The strobe in signal occurs no more frequently than every other clock cycle. The turbo encoder updates I, Q, and ready_out with valid data on the clock cycle immediately following the strobe_in.

Output:
I, Q: encoded bit for modulation when in the encoder mode. I and Q take the value of bit_in when in bypass mode.
ready_out: qualifier for I and Q to indicate that they contain valid data.
strobe_out: one clock cycle strobe indicating that the turbo encoder is capturing the bit_in and ready_in on this clock cycle. The strobe_out signal is the same signal that is enabling the turbo encoder's internal flip-flop. The strobe_out signal is asserted no more frequently than every other clock cycle, but valid data must be available on the following clock cycle.

The interleaver 310 uses an S-random permutation approach as discussed in the theory of operation. While bits are written into the interleaver in contiguous frames, they exit the interleaver in random order. In a preferred embodiment, the frame interleaver supports an arbitrary frame size up to 2048 bits. The non-interleaved data stream is delayed to match the latency through the interleaver.

From the stream of input data bit_in, the interleaver 310 generates the following signals to the serial-to-parallel converter 320: (1) the interleaved bits su1' and su2', (2) the non-interleaved delayed bits su1 and su2, (3) the first_bit_in to indicate the first bit of a block, and (4) ready_in to indicate valid data.

The serial-to-parallel converter 320 performs pairing on both the delayed bit stream and the interleaved bit stream. For example, if the delayed bit stream (or the interleaved bit stream) entering the block in the following order:

[bo, b1, b2, b3, b4, b5, b6, b7, . . . ]

then the output stream will become:

[{b0, b1}, {b2, b3}, {b4, b5}, {b6, b7}, . . . ]

The serial-to-parallel converter 320 receives the delayed bits su1, su2 and the interleaved bit su1' and su2'. The serial-to-parallel converter 320 generates the pairs of data {pu1, pu2} and {pu1', pu2'} corresponding to the su1, su2 and su1', su2', respectively. In addition, the serial-to-parallel converter 320 passes the ready_in and first_bit signals to the rate encoders.

The first rate encoder 332 receives the delayed bits pair (pu1, pu2), the ready_in, first_bit and strobe signals. The first rate encoder 332 generates the encoded ru1, ru2, and rc3 signals. The second rate encoder 334 receives the interleaved bit pair (pu1', pu2'), the ready_in, first_bit, and strobe signals. The second rate encoder 334 generates the encoded ru1', ru2', and rc3' signals. The second rate encoder 334 also passes the ready_in and first_bit signal to the symbol generator 340.

The symbol generator 340 receives the encoded ru1, ru2, and rc3 from the first rate encoder 332; the encoded rc3' signal from the second rate encoder 334; and the ready_in and first_bit signals passed from the second rate encoder 334. The symbol generator 340 generates the symbol I and Q signals and the ready out and first_bit_out signals. The symbol generator 340 also receives the strobe_in signal.

The I and Q signals are generated according to the following pairings:

I=ru1, ru2 and Q=rc3, rc3'

In the first clock, I and Q are ru1 and rc3, respectively. In the next clock, I and Q are ru2 and rc3', respectively.

Figure 9:
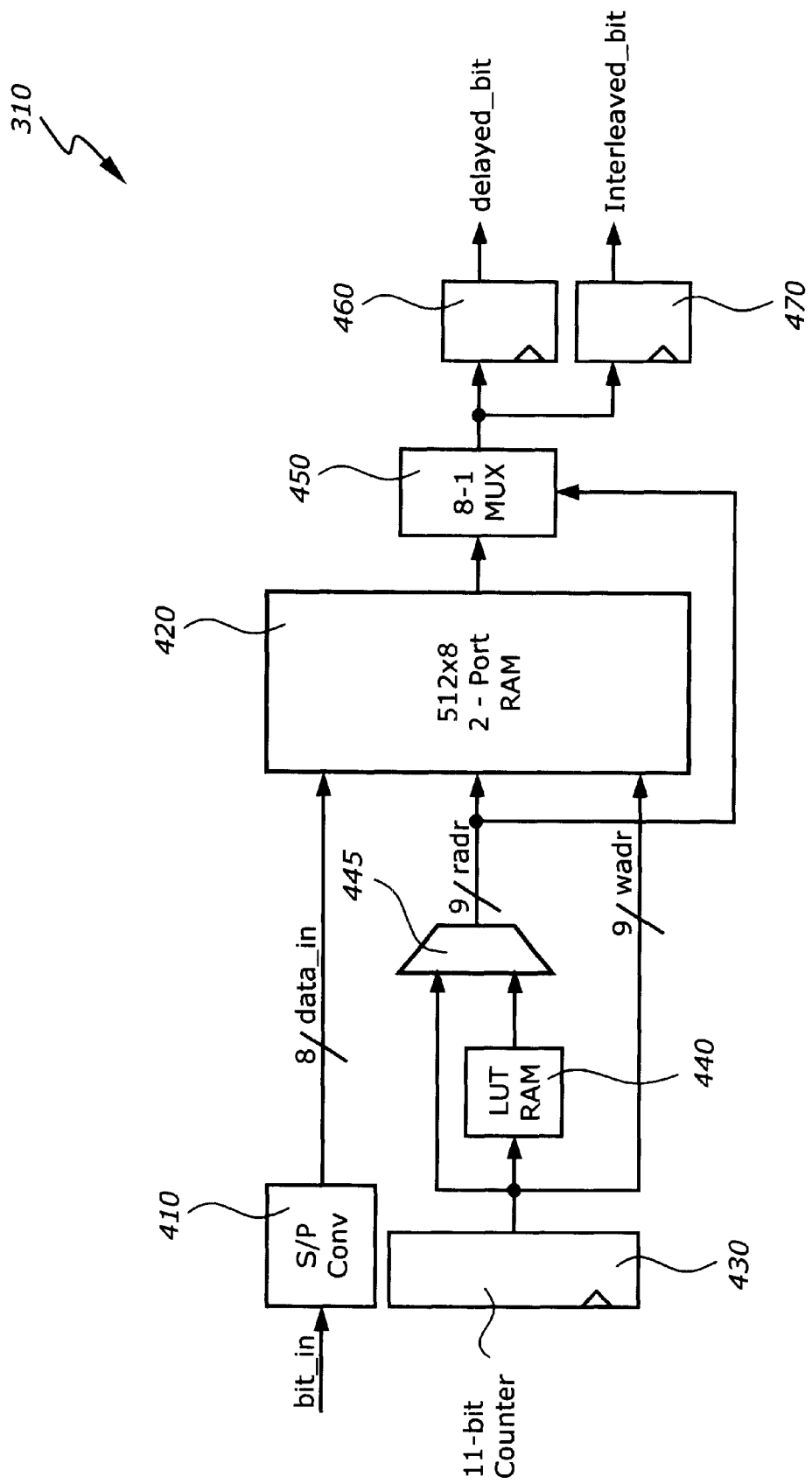
FIG. 9 is a diagram illustrating in detail an interleaver shown in FIG. 8 according to a preferred embodiment of the present invention.

FIG. 9 is a diagram illustrating in detail an interleaver 310 shown in FIG. 8 according to a preferred embodiment of the present invention. The interleaver 310 includes a serial-to-parallel converter 410, an interleaver RAM 420, a counter 430, a look-up table RAM (LUT RAM) 440, a first multiplexer 445, a second multiplexer 450, a delay register 460, and an interleave register 470.

The serial-to-parallel converter 410 receives the bit_in signal representing the serial bit stream and converts the serial bit stream into 8-bit parallel data, data_in, to be written into the interleave RAM 420. The interleave RAM 420 stores the data in sequential addresses according to the order they arrive. In a preferred embodiment, the interleave RAM 420 is a 512×8 dual-ported RAM. The dual-ported architecture allows the interleave RAM to be written and read out at the same time. Other embodiments using a double-buffered RAM is also possible with a block delay. The counter 430 is an 11-bit counter to generate the addresses for the interleave RAM 420 and the LUT RAM 440. The LUT RAM 440 stores a random pattern to decorrelate the data in the block. The addresses generated by the counter 430 are translated by the LUT RAM 440 into other addresses to read the interleave RAM 420 when decorrelation is desired. The two-to-one multiplexer 445 selects between the addresses generated by the counter 430 and addresses translated by the LUT RAM 440 to provide the read addresses to the interleave RAM 420. The eight-to-one multiplexer 450 selects the data out from the interleave RAM 420. The delay register 460 latches the non-interleaved data and the interleave register 470 latches the interleaved data as effectuated by the addresses from the LUT RAM 440.

Figure 10:
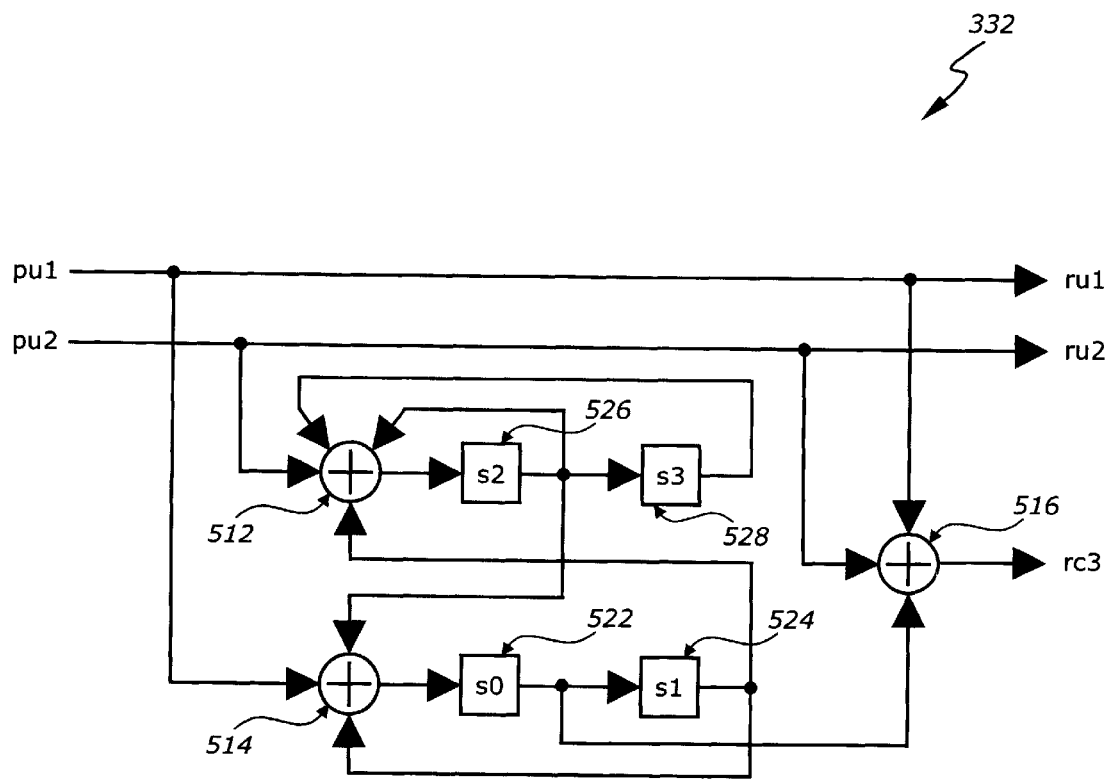
FIG. 10 is a diagram illustrating in detail a rate encoder shown in FIG. 8 according to a preferred embodiment of the present invention.

FIG. 10 is a diagram illustrating in detail a rate encoder 332 shown in FIG. 8 according to a preferred embodiment of the present invention. The first rate encoder 332 and the second rate encoder 334 are essentially the same. For purposes of illustration, only the first rate encoder 332 is described. The second rate encoder 334 has a similar description. The first rate encoder 332 receives two inputs pu1 and pu2, and generates three outputs: ru1, ru2, and rc3. The first rate encoder 332 includes three adders 512, 514, and 516, and four delay (or register) elements s0 (522), s1 (524), s2 (526), and s3 (528).

The three adders 512, 514, and 516 are binary modulo-2 adders. Each adder may comprise a number of 2-input adders. The adder 512 receives 4 inputs from s1, s2, pu2, and s2. The adder 512 generates the input to the s2 register 524. The adder 514 receives 3 inputs from s1, s2, and pu1. The adder 514 generates the input to the s0 register 522. The adder 516 receives three inputs pu1, pu2, and s0. The adder 516 generates rc3.

The register elements 522, 524, 526, and 528 implement a state machine using four states s0, s1, s2, and s3. The state equations are:

$$s3^*=s2$$

$$s2^*=s3+s2+s1+pu2$$

$s1^* = s0$ $s0^* = s2 + s1 + pu1$ where the * denotes the next state.
The output equations are:

$rc3 = s0 + pu2 + pu1$ $ru2 = pu2$ $ru1 = pu1$

In a preferred embodiment, both the first and second rate encoders are initialized at the frame boundaries so that the first bit of each frame is applied to an encoder in the "all zeros" state.

The second rate encoder 334 operates essentially in the same manner as the first rate encoder 332. The second rate encoder receives the two inputs pu1' and pu2' and generates three outputs ru1', ru2', and rc3'. However, only the rc3' output is used.

The first and second rate encoders 332 and 334 also receive the strobe, ready, and first_bits_in signals to control the timing and pass these signals onto the next processing module, i.e., the symbol generator 340. The first and second rate encoders 332 and 334 generates four outputs ru1, ru2, rc3, and rc3' which become four inputs to the symbol generator 340.

Synchronization

Synchronization word insertion may be performed or bypassed depending on the system operational mode.

The turbo encoder inserts an 80-bit pattern as 40 I/Q pairs every Nsync frames where Nsync is programmable between 1 to 16.

FIG. 11 shows the synchronization pattern as 40 I/Q pairs according to a preferred embodiment of the invention. In FIG. 11, row 1 corresponds to the first I/Q pair transmitted.

Figure 12:
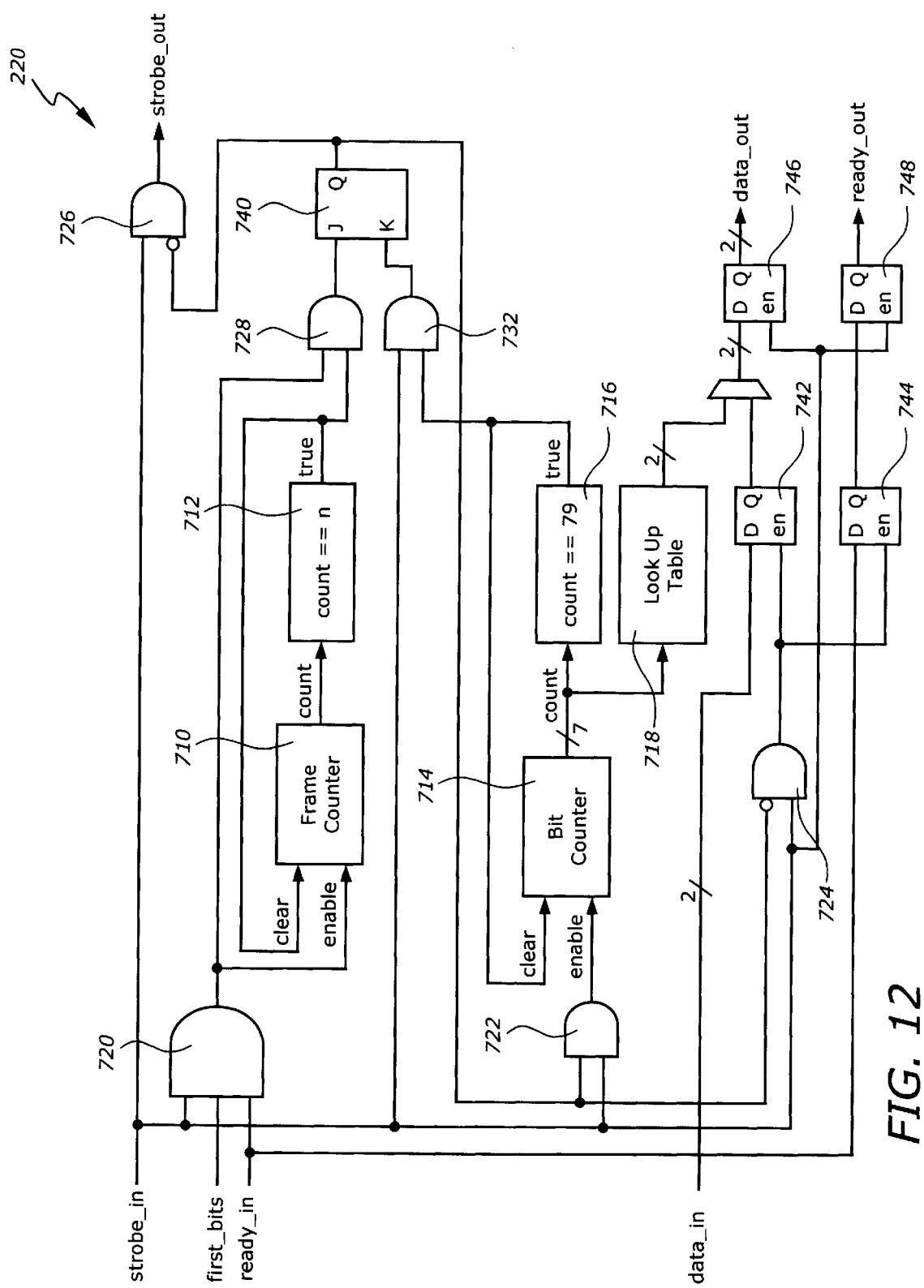
FIG. 12 is a diagram illustrating in detail a synchronization inserter shown in FIG. 7 according to a preferred embodiment of the present invention.

FIG. 12 is a diagram illustrating in detail a synchronization inserter 220 shown in FIG. 7 according to a preferred embodiment of the present invention.

The synchronization inserter 220 includes a frame counter 710, a count-n comparator 712, a bit counter 714, a count-79 comparator 716, a look-up table (LUT) 718, AND gates 720, 722, 724, 726, 728, 732, a J-K flip flop 740, and D flip-flops 742, 744, 746, and 748.

The frame counter 710 keeps track of the number of frames. The count-n comparator 712 determines if the number of frame has reached n where n is a programmable value. The count-n comparator 712 may be implemented by gating the output of the frame counter with AND-OR gates that match the n value. When the frame counter 710 reaches n, the count-n comparator 712 asserts the true signal which is used to clear the frame counter 710 to zero to start the counting sequence.

The bit counter 714 keeps track of the number of synchronization bits being generated. The count-79 comparator 716 determines if the number of bits has reached 79 which is the number of synchronization bits in the sync pattern. The count-79 comparator 716 may be implemented by gating the output of the frame counter with AND-OR gates that match the value of 79. When the bit counter 714 reaches 79, the count-79 comparator 716 asserts the true signal which is used to clear the bit counter 714 to zero to start the counting sequence.

The output of the bit counter 714 is used to index the LUT 718 to generate the I/Q sync pattern as shown in FIG. 11. The LUT 718 can be implemented by a RAM or a ROM. The LUT RAM is loaded with the sync entries by software during initialization.

The AND gate 720 generates the frame counter enable signal when the strobe_in, first_bits_in, and ready_in signals are all true. The AND gate 722 generates the bit counter enable signal when the strobe_in signal is asserted and when the frame count is in progress as latched by the D flip-flop 740. The AND gate 724 enables the latching of the data in when the strobe_in signal is asserted and when the synchronization insertion is finished. The AND gate 726 generates the strobe_out signal by propagating the strobe_in signal when the sync insertion is completed as indicated by the J/K flip flop 740. The AND gate 728 sets the J/K flip-flop 740 when data are valid and end of frame is reached. The AND gate 732 clears the J/K flip-flop 740 when strobe_in is asserted and the synchronization reaches bit 79.

The J/K flip-flop 740 serves three functions. One is to gate the strobe_out signal via the AND gate 726, one is to latch the enable condition for the bit counter 714, and one is to select between the sync stream and the data stream. The D flip-flop 742 latches the data in stream. The D flip-flop 744 latches the ready_in signal. The D flip-flop 746 latches the signal selected between the sync pattern and the data stream and generates data_out. The D flip-flop 748 latches the latched ready_in to generate the ready_out signal.

A Preferred Embodiment of a Turbo Decoder

Figure 13:
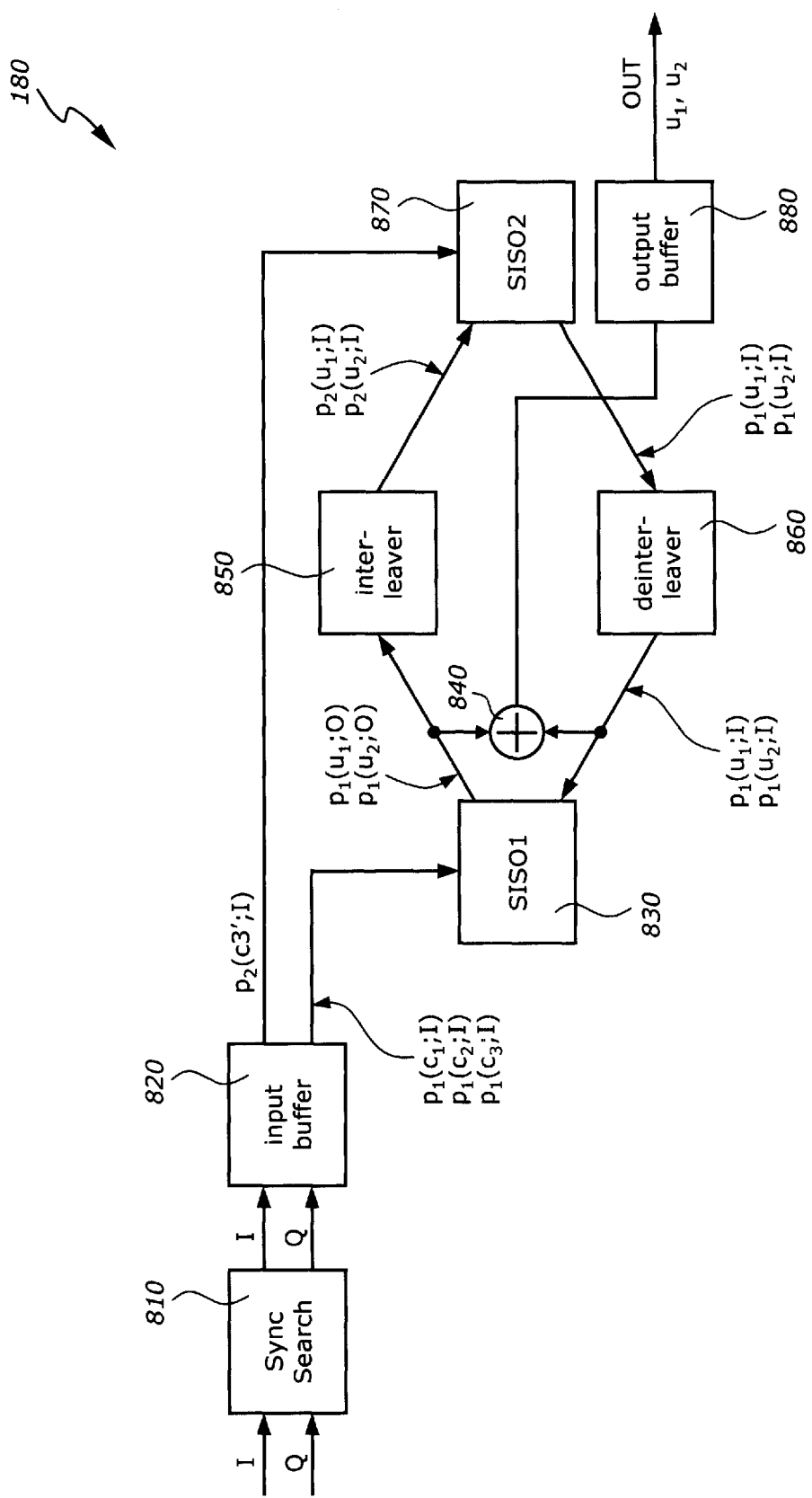
FIG. 13 is a diagram illustrating in detail a turbo decoder shown in FIG. 1 according to a preferred embodiment of the present invention.

FIG. 13 is a diagram illustrating in detail a turbo decoder 180 shown in FIG. 1 according to a preferred embodiment of the present invention. The turbo decoder 180 includes a sync search engine 810, an input buffer 820, a first Soft In Soft Out (SISO1) circuit 830, an adder 840, an interleaver 850, a de-interleaver 860, an SISO2 870, and an output buffer 880. The SISO1 830 and SISO2 870 have almost identical structures.

In general, the turbo decoder 180 operates as follows. The incoming channel symbols are examined by the sync search engine to detect the sync pattern inserted at the encoder. When the sync patterns are detected, they are deleted and the remaining code symbols are stored in the input buffer 820. Data are stored for later use because the turbo decoder uses the same data several times during the decoding process. The SISO1 830 corresponds to the upper code generator, i.e., the first rate encoder 332 in FIG. 8. The SISO2 870 corresponds to the lower code generator, i.e., the second rate encoder 334 in FIG. 8. The SISO1 830 decodes a block of encoded bits using the received symbols C1, C2, and C3. The symbols C1, C2, and C3 correspond to the symbols ru1, ru2, and rc3 in the encoder, respectively. The output of the SISO1 830 includes u1 and u2 which are improved estimates of C1 and C2, respectively. The outputs of the SISO1 830 are then interleaved just as they were in the encoder, and presented to the SISO2 870. The SISO2 870 decodes the same block using the estimated U1 and U2 and the received C3'. The C3' corresponds to the symbol rc3' in the encoder. The output of the SISO2 870 is another estimate of U1 and U2, which are then de-interleaved to put them back in their original order. This is the first iteration. For the second and subsequent iterations, SISO1 830 uses the original data again, modified by the estimated U1 and U2, and takes another pass through the data and interleave the result. The SISO2 870 takes another pass and de-interleaves the result, and so on, for as many iterations as needed to produce the required performance. On the final iteration, the output of the SISO1 830 is added to the output of the de-interleaver (after a pass through the SISO2 870), hard-limited, and this becomes the decoded output data.

Sync Search Engine

The sync search engine 810 receives the I and Q data streams as generated by the demodulator 170 (FIG. 1). The sync search engine 810 searches for the sync word in all four possible orientations, according to the modulation type. The four correlators look for the I or Q codeword in both true and inverted polarities. Each correlator produces a "score" that is the number of places in which the signs of the most recent 40 received symbols match the I or Q codeword. The scores for each channel are added or subtracted in various combinations depending on the modulation type, to produce a final score. A codeword hit (CWH) is declared if the final score exceeds the programmed threshold in either the positive or negative direction.

The sync search engine 810 is supported by a state machine which has three states: search, trial lock, and lock. In the search state, the sync search engine 810 looks for a CWH continuously. If found, the orientation is noted and the state machine goes to the trial lock state. In the trial lock state, the sync search engine 810 looks for the programmable N consecutive CWHs at the same orientation during a specified time interval. If the specified time interval expires and there is no CWH, the state machine returns to the search state. If a CWH with a different orientation is found, the hit count is re-started with the new orientation. If N consecutive CWH's are found, the state machine goes to the lock state. The data orientation is set to be the successful trial orientation. In the lock state, there are two options. In the first option, the sync search engine 810 stays the same until re-initialized by software. In the second option, the search engine 810 continues to monitor CWH's and drops out the lock state after M consecutive misses where M is a programmable integer.

Input Buffer

The input buffer 820 stores the I-Q data for later processing. In a preferred embodiment, the input buffer 820 is a random access memory (RAM) having 12N bytes, organized as 6N×2 bytes. In a preferred embodiment, the value of N is 2048. The input buffer 820 can be implemented in three ways: (1) six planes of N×2 bytes single-port RAM, (2) 3 planes of 2N×2 bytes dual unidirectional ported RAM, and (3) single 6N'2 bytes triple unidirectional ported RAM. Logically, the input buffer 820 has three ports: one for writing new data, one for reading by the SISO1 830, and one for reading by the SISO2 870.

The input buffer 820 has two read ports, one for the SISO1 830 and one for the SISO2 870. The two SISOs 830 and 870 are never in the same plane at the same time. Each of the SISO's 830 and 870 provides a read-enable and a read address consisting of an 11-bit address and a 2-bit plane select. The read-enable is mainly for power control, to power up the addressed RAM only when reading is actually in progress. Each of the three RAMs has a mux to select its read address; when the plane-select of the SISO1 830 points to a particular RAM, that RAM's mux steers the address of the SISO1 830 to its address input and the read-enable of the SISO1 830 to its chip-select input. Otherwise it steers the controls of the SISO2 870 to its address and chip-select inputs if the plane-select of the SISO2 870 points to it. If neither plane-select points to it, it shuts off the RAM's chip-select. The outputs of the three RAMs are multiplexed together to produce two output busses, one for each of the SISO's 830 and 870. These multiplexers are controlled by the respective SISO's plane-selects.

In a preferred embodiment, the input buffer 820 consists of three planes of 4K×14 dual unidirectional-port RAM (for N=2048), associated decoding and muxing logic, and the write-address counter. It also contains the free-running toggle flip-flop that provides the phase signal to the rest of the Decoder. Data from the upstream module arrives at the real-time symbol rate, qualified by the symbol strobe strobe_in and ready in (called sync strobe and sync ready after they pass through the sync correlator module). The global initialize signal sets the write-address counters to their initial state, waiting for the strobe and ready signals. The write-address counters count module-Nbl and Nbl-per-N, just as the SISO read addresses do, to ensure that the same RAM locations are accessed and in the proper order, for both read and write. After writing Nbl×Nbl-per-N locations in one plane, filling no more than half of it, the write counter proceeds to the second plane for the next Nbl×Nbl-per-N symbols, and finally to the third plane for the last block of N. After writing three blocks of N, the input buffer 820 issues the start signal to SISO1 830, which then begins a decoding cycle. Meanwhile the input buffer 820 collects another 3N symbol pairs using the other half of each of the three planes. Each time it switches halves, it issues a start signal. Presumably, the SISO1 830 and SISO2 870—will finish their decode cycles before or concurrently with each start signal from the input buffer 820.

When the ready_in signal is true, data will be written into the buffer when the strobe occurs. If ready_in goes false, writing will stop. If ready_in goes false to indicate the end of a block-oriented message, it will be necessary to ensure that this occurs at a 3N boundary, so that the half buffer is filled and the input buffer 820 will issue the start signal. If the message ends with a half buffer unfilled, the tail end will not get decoded. The ready_in going false does not reset the write pointer, it just stops where it is and will continue if ready_in should go true again. In FDMA mode, when using the sync correlator, the write pointers can be reset to the start of the buffer with the sync_wordfound pulse. When the correlator finds the sync word and declares sync, it issues the sync_wordfound to restart the decoder at the beginning of a 3N block.

SISO Modules

The SISO1 830 processes the soft decision statistics, $\pi_1(c1;I)$, $\pi_1(c2;I)$, and $\pi_1(c3;I)$ which corresponds to the encoded bits, c1, c2 and c3, from the demodulator and the extrinsic information from the SISO2 870, $\pi_1(u1;I)$ and $\pi_1(u2;I)$, which corresponds to the information bits, u1 and u2. For every first iteration at each turbo code block boundary, $\pi_1(u1;I)$ and $\pi_1(u2;I)$ are set to zero since extrinsic information from the SISO2 870 has not been calculated yet; at subsequent iterations, $\pi_1(u1;I)$ and $\pi_1(u2;I)$ from the SISO2 870 are used. The SISO1 830 calculates extrinsic information, $\pi_1(u1;O)$ and $\pi_1(u2;O)$, for the SISO2 870.

$\pi_1(u1;O)$ and $\pi_1(u2;0)$ from the SISO1 830 are interleaved in the same manner as information bits are interleaved in the turbo encoder. The permuted extrinsic information, $\pi_1(u1;I)$ and $\pi_1(u2;I)$, together with the soft decision statistics $\pi_1(c3';I)$ from the demodulator are used to generate extrinsic information, $\pi2(u1;O)$ and $\pi2(u2;O)$, for the SISO1 830. $\pi2(c3';I)$ corresponds to the non-systematic encoded bit from constituent encoder 2.

The adder 840 obtains the p1(u1;O) and p1(u2;O) from the SISO1 830 and the p1 (u1;I) and p1(u2;I) from the de-interleaver 860 to generate the decoded output bits, u1 and u2. After the specified number of iterations has been performed by the turbo decoder, hard decision of the information bit, u1 and u2, for the entire turbo code block can be obtained by:

u1=hard-decision of $[\pi1(u1;O)+\pi1(u1;I)]$, and u2=hard-decision of $[\pi1(u2;O)+\pi1(u2;I)]$ In a preferred embodiment, the bit widths of demodulator soft decision and extrinsic information are 6-bit and 7-bit, respectively. Demodulator soft decision and extrinsic information use 2's complement representation.

Interleaver De-interleaver

The interleaver 850 and the de-interleaver 860 consist of 3 planes of 2K×8 dual-port RAM, plus one 2K×11 dual-port RAM for the permutation LUT. Each SISO provides a read address, a write address, and associated enable signals. Note that the two SISOs never address the same plane at the same time (see FIG. 14 again). Each address bus contains an 11-bit address within the plane and a 2-bit plane select. Each of the three RAMs have muxes at both of their address inputs to select either the read address from one SISO or the write address from the other. Each RAM has one input port dedicated to SISO1 830 and the other to SISO2 870. Likewise one output port from each goes to SISO1 830 and the other to SISO2 870. The output ports are multiplexed together in 3×1 muxes controlled by the respective read-plane selects.

The SISO2 870 read and write addresses pass through the permutation LUT before reaching the interleaver/de-interleaver RAM. The permutation LUT adds a delay of 1 clock tick, so the SISO1 inputs have an extra register to compensate and keep the timing of both SISOs the same. The permutation LUT is a 2K×11 dual-port RAM. In operation, one port is dedicated to the SISO2 write address and the other to the SISO2 read address, so the SISO2 870 can read and write the interleaver 850 and the de-interleaver 860 simultaneously. The permutation LUT is loaded off-line via the host processor bus using the SISO2 read address to step through the address space. The data comes from the host processor bus.

The interleaver/de-interleaver data path is 8 bits wide, 7 bits for the extrinsic information calculated on each iteration by the SISOs and one bit for the original received symbol information (sign) bit, to be saved for the channel error counting function. When SISO1 reads the received symbols from the input buffer, it passes the sign bits from the systematic symbols (c1,c2) through to the output with its updated extrinsic information and writes them into the interleaver 850. SISO2 870 gets them from the interleaver 850 and passes them through with its updated extrinsic information and writes them into the de-interleaver 860, so that the original received symbol information bits emerge from the de-interleaver 860 concurrently with the corresponding decoded bits, in the correct time order. The operation will be repeated with every iteration, though only the last iteration is meaningful.

Output Buffer

The output buffer 880 is a 3N×1 FIFO, which alternatively may be implemented using ×4 or ×8 RAM cell (768×8). This RAM cell requires dual unidirectional (1W, 1R) ports. The decoded data bits are dumped into the FIFO as they emerge from the de-interleaver 860 after the last iteration. The decoded bit is the sign bit of the extrinsic information byte. The bits are read out at the same rate, using the same symbol strobe, as the incoming I and Q symbols going into the input buffer 820. The output buffer 880 also performs the quality monitor function by filtering the magnitude of the extrinsic information bytes.

In order to do the channel error counting function, the original received symbol systematic bits are saved and passed through the decoder along with the extrinsic information bytes. At the output, the saved systematic bits are compared to the decoded extrinsic information sign bits to provide a channel error signal. Channel errors are counted over a programmable interval to provide a rate which will be readable via an interface bus.

Timeline

Figure 14:
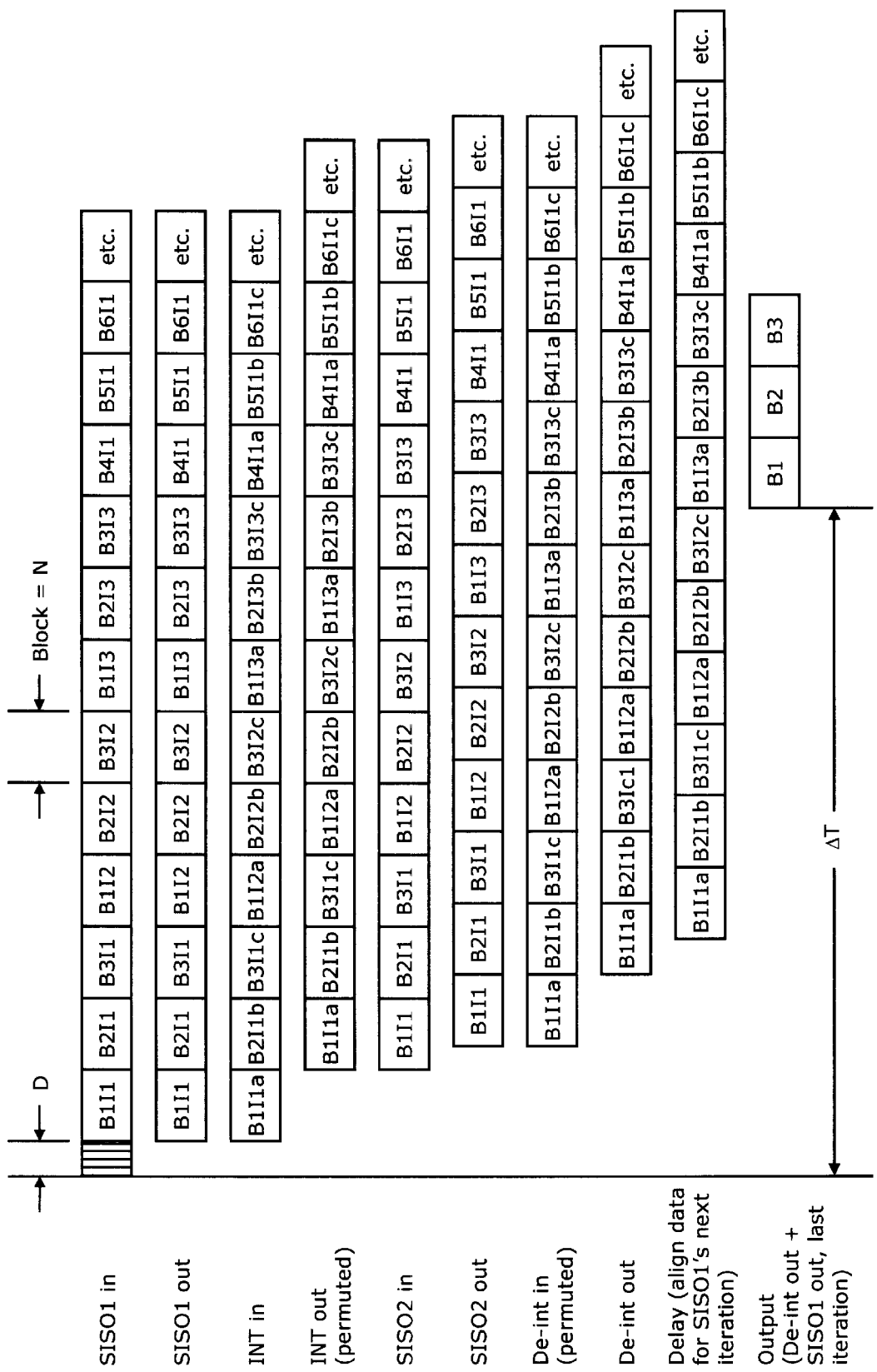
FIG. 14 is a diagram illustrating a timeline of a decoder process according to a preferred embodiment of the present invention.

FIG. 14 is a diagram illustrating a timeline of a decoder process according to a preferred embodiment of the present invention.

In a preferred embodiment, the throughput requirement is 20 Mbps with two iterations, using a 40 MHz computation clock. To satisfy this requirement, the turbo decoder should be able to process the equivalent of one bit per clock tick continuously. One iteration consists of a cycle of SISO1 to interleaver to SISO2 to de-interleaver back to SISO1. This loop forms a pipeline with a latency equal to two interleaver blocks (N) plus 2 SISO processing delays (D): round-trip delay=2(N+D). The interleaver latency is due to its block nature, where the entire interleaver is filled before it can be read. Therefore there is a delay of N from the first bit written until the first bit is available to read. The SISO processing delay comes about because of the need to collect a block NBl of data before it can be processed. The delay from the time the first bit goes into the SISO until it comes out again will be about 3 to 4 NBl. D is much less than N, so the round-trip delay will be less than 3N. In order to keep up with the throughput, this pipeline is kept full continuously, therefore there are 3N-blocks at a time in the pipeline.

The timeline shows a sequence of operations within the decoder. To keep the pipeline fully occupied, three blocks of N are processed at a time, labeled B1, B2, and B3. Three iterations are shown, labeled I1, I2, and I3. This timeline shows the sequence as though the decoder completed its 3 iterations in exactly 3N bit periods, that is, the data rate is 40/3=13.33 Mbps, so that it starts processing blocks B4–B6 immediately upon finishing B1–B3. Usually, the decoder will finish before the next set of blocks arrives, so there will be a gap between B3 I3 and B4 I1. While the decoder is operating on B1–B3, the input buffer is collecting B4–B6. The input buffer stores 6N symbols, where a symbol is an IQ pair, for a total of 12N bytes. There is an overlap between B3 I3 at SISO2 IN and B4 I1 and even a little of B5 I1 at SISO1 IN. This means that B3 continues to be available even as the processing of the next block begins. At this time, the input buffer is collecting B7 and overwriting B1. This is acceptable because even at the highest data rate, SISO2 certainly finishes B3 before B9 arrives and overwrites it. Finally, because the decoder processes three blocks at a time, the output buffer holds at least 3N bits.

The interleaver and de-interleaver can be combined into one unit that shares its RAM. The SISO1 reads from the de-interleave and writes to the interleaver in sequential order. The SISO2 reads from the interleaver and writes to the de-interleaver in permuted order. Both SISO's would write back to the same address they read from, if it were not for the processing delay, so only two planes of N bytes would be needed to serve both the interleaver and de-interleaver. However, because of processing delays, the SISOs actually write back to the address they read from D clocks ago, and a third plane of N is needed so that block n+2 out of SISO1 will not overwrite block n returning from the de-interleaver. Since block n from the de-interleaver is ready and available before SISO1 needs it for the next iteration, the readout operation is delayed until SISO1 finishes block n+2 of the current iteration.

To produce the final output, on the last iteration, the output of SISO1 is added to the output of the de-interleaver. These two outputs in their unpermuted order are separated in time by 2N+D, the delay through the interleaver, SISO2, and the de-interleaver. However, in their permuted order, they are separated by only D, the delay through SISO2. When SISO2 reads the interleaver on the last iteration, it saves the data until it finishes processing it, then it adds the input and output data together before writing it back out to the de-interleaver. Later, the final data is read out from the de-interleaver and dumped into the output buffer in normal order.

The latency through the entire decoder, from the time a symbol enters the input buffer until the corresponding decoded bit emerges from the output buffer, is about 6N symbol periods.

D is a decoder processing delay which is equal to 3NBl. ΔT is the time required to process 3 blocks of N, which is less than or equal to the time required to collect the same. The input buffer holds 2*3*N channel symbols=12N bytes, where each symbol is two soft-decision words of no more than 8 bits each. The input buffer has three ports: one write port at symbol rate and two read ports at processing rate (one for each SISO).

The interleaver/ de-interleaver needs three planes of N soft-bits (no more than 8 bits wide). The third plane is used as a delay line to realign data for the next iteration. A LUT of N*log2(N) bits is used by the SISO2 to read the interleaver and then write to the de-interleaver at the same location D ticks later.

The output buffer is a FIFO of at least 3N hard-decision bits. This is necessary if the downstream components cannot handle the burst rate or there is not enough elasticity to smooth the burst out to a continuous user rate.

The SISO Algorithm

As discussed before, the turbo decoder uses a modified MAP algorithm, which is sometimes referred to as the BCJR algorithm. The BCJR algorithm is inherently block-oriented. It does two recursions through a block of data, one forward and one backwards. The forward recursion starts at the beginning of the block and calculates the probability of paths through the code trellis from beginning to end. Each state at each timestep will be assigned a forward metric called "A", related to its probability calculated by combining the probability of a predecessor state with the probability of the received symbol at that timestep. Similarly, the backward recursion starts at the end of the block and calculates the probability of paths through the code trellis from the end back to the beginning. Each state at each timestep will be assigned a backward metric called "B", related to its probability calculated by combining the probability of a successor state with the probability of the received symbol at that timestep. The output, called "extrinsic information" is then calculated at each timestep by combining the A's, B's, and received symbol metrics. Since the algorithm works on a block of data of length N at a time, a large memory is required to save all the received symbols for the block, as well as either the A's or B's calculated for that block. The sliding-window-group (SWG) method is a compromise that reduces the amount of memory required at the cost of slightly reduced performance. Instead of performing the back recursion on the entire block all at once, only a small group is processed at a time. The drawback is that now each group needs to be initialized with a "training" recursion, instead of a single initialization at the end of the block. This training recursion is just as complicated as the full one, except that the B values are not saved. Only the final set of B's are saved to initialize the full recursion. To summarize the tradeoff:

The full-block recursion requires 16*N/2 bytes (16 Kbytes for N=2048) of memory to store the B's for N/2 timesteps (there are 2 bits per timestep) times 16 states per timestep.

The SWG recursion requires 16*Nbl bytes (2 Kbytes for Nbl=128) of memory to store the B's for Nbl timesteps times 16 states per timestep, plus an entire second back recursion trellis of about 8800 gates in order to perform the training recursion simultaneously with the full recursion.

Given these values for N and Nbl and considering only the SISO, the full-block vs. SWG architecture appears to be about an even trade. However it is necessary to consider also the sizes of the input and output buffers and interleaver/de-interleaver. The full-block architecture has a round-trip latency of 4N whereas that of the SWG is 3N. Therefore the full-block SISO would need another 2*2N bytes of input buffer, N bits of output buffer, and N bytes of interleaver/de-interleaver RAM, in order to keep the pipeline fully loaded for maximum throughput.

Figure 15:
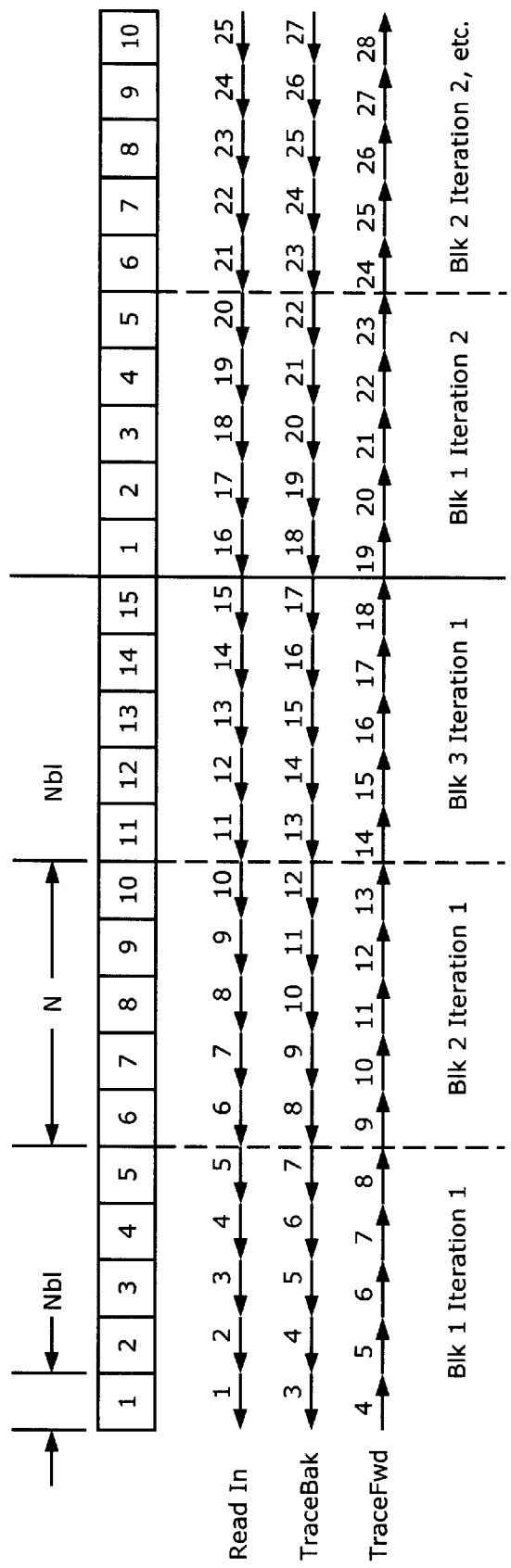
FIG. 15 is a diagram illustrating a timeline of a sequence of operations in the SWG-SISO according to a preferred embodiment of the present invention.

FIG. 15 is a diagram illustrating a timeline of a sequence of operations in the SWG-SISO according to a preferred embodiment of the present invention. For brevity, this diagram shows only 5 Nbl blocks per N, but in reality there will be about 10 or more. Note that the number of Nbl blocks per N is ≧6 in order to claim that the round trip delay 2(N+D)<3N when the decoder processing delay D=3 Nbl. Across the top are the groups of Nbl, 5 per block of N, 3 blocks processed before repeating for the second iteration. The next three lines refer to the operations of the three trellises in the SISO at each group of timesteps. Note that the result of the first training recursion (timestep 1) cannot be used because this is the boundary between blocks. The second training recursion (timestep 2) results in an initial value to begin the full recursion in timestep 3. In timestep 4, the B's from step 3 are available for use in the forward recursion. The extrinsic information calculation follows immediately behind the forward recursion and outputs the results. Thus there is a delay of 3 Nbl timesteps from the time the first group is presented at the input and the resulting decoded data comes out.

Note that at the end of each block, there is no training result available for the full back recursion, because the training recursion has crossed the block boundary and gone on into the next block of N. At this time the back recursion will be initialized with a compromise value of all-zero because, without explicitly terminating the trellis, the final state of the code is unknown. To begin the next block, the forward recursion will be initialized with state 0=0 and other states max because the initial state of the code is always forced to 0 in the encoder.

Referring to FIG. 15, the timesteps are as follows:

1: read in (backwards) Nbl 1 and do initial (dummy) traceback.

2: read in NBL 2, initial traceback on 2, issue start to full traceback.

3: read in NB1 3, initial traceback on 3, full traceback on 1 using result of 2, issue start to traceforward.

4: read in Nbl 4, initial traceback on 4, full traceback on 2 using result of 3, traceforward on 1, initializing with state 0=0, others=max.

5: read in Nbl 5, initial traceback on 5, full traceback on 3 using result of 4, traceforward on 2.

. . . and so on until a new block . . .

6: read in (backwards) Nbl 6 and do initial (dummy) traceback, full traceback on 4 using result of 5, traceforward on 3.

7: read in NBl 7, initial traceback on 7, full traceback on 5 using compromise initial value 0, traceforward on 4.

8: read in NBl 8, initial traceback on 8, full traceback on 6 using result of 7, traceforward on 5.

9: read in Nbl 9, initial traceback on 9, full traceback on 7 using result of 8, traceforward on 6, initializing with state 0=0, others=max.

10: read in Nbl 10, initial traceback on 10, full traceback on 8 using result of 9, traceforward on 7.

. . . and so on until three blocks have been processed and the next iteration is started.

16: read in Nbl 1 again, for iteration 2, and do initial (dummy) traceback, full traceback on 14 using result of 15, traceforward on 13.

17: read in NBl 2, initial traceback on 2, full traceback on 15 using compromise initial value 0, traceforward on 14.

18: read in NBl 3, initial traceback on 3, full traceback on 1 using result of 2, traceforward on 15.

19: read in Nbl 4, initial traceback on 4, full traceback on 2 using result of 3, traceforward on 1, initializing with state 0=0, others=max.

20: read in Nbl 5, initial traceback on 5, full traceback on 3 using result of 4, traceforward on 2.

. . . and so on . . .

Figure 16A:
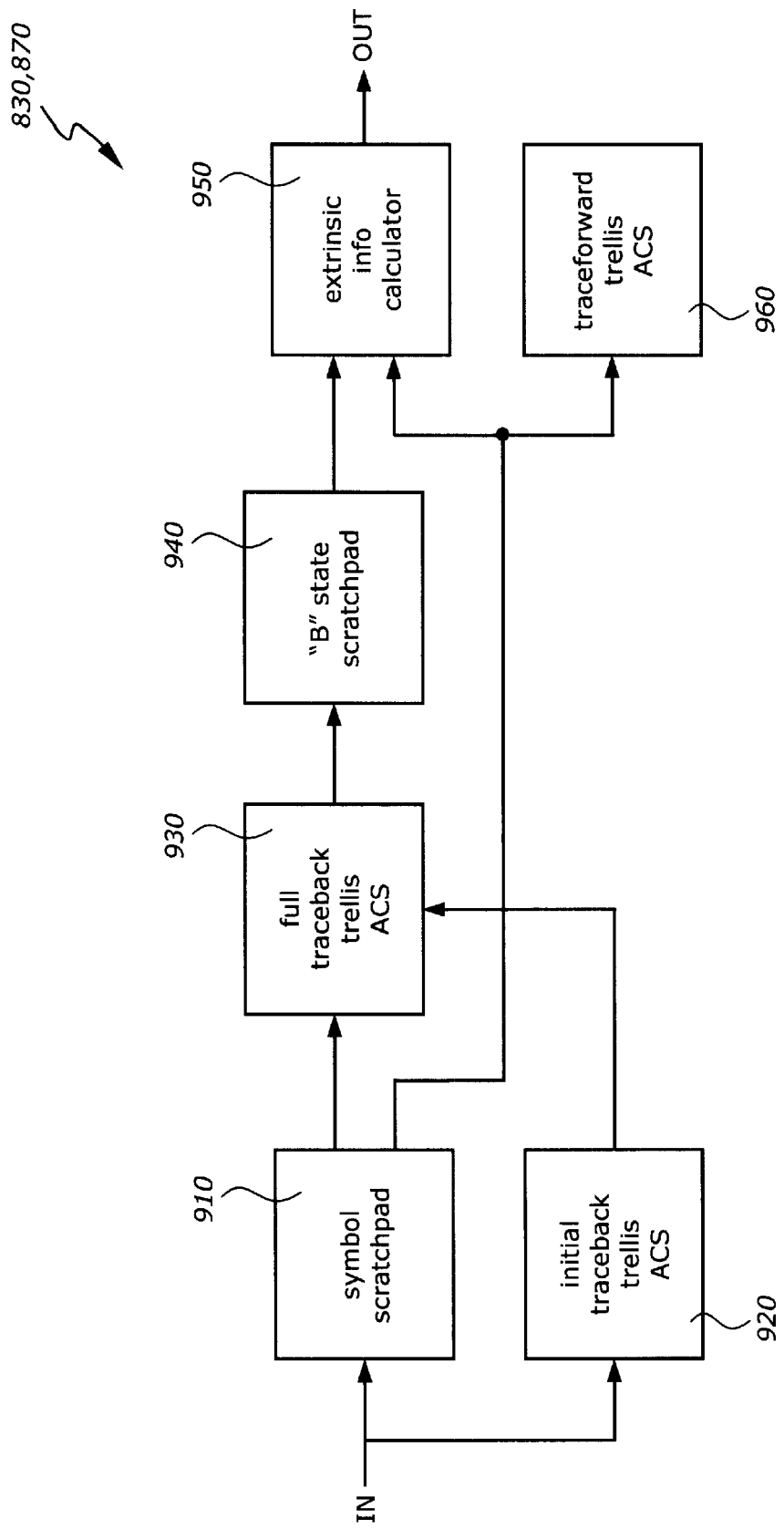
FIG. 16A is a diagram illustrating in detail one of the SISO units shown in FIG. 13 according to a preferred embodiment of the present invention.

FIG. 16A is a diagram illustrating in detail one of the SISO units 830 and 870 shown in FIG. 13 according to a preferred embodiment of the present invention. The SISO includes a symbol scratchpad 910, an initial traceback trellis unit 920, a full traceback trellis unit 930, a traceforward trellis unit 960, a B state scratchpad 940, and an extrinsic information calculator 950.

The symbol scratchpad 910 stores the extracted code symbols from the input buffer 820 (FIG. 13). The initial traceback trellis unit 920 performs the initial traceback operation on the extracted code symbols from the input buffer 820. The full traceback trellis unit 930 performs the full traceback operation on the result of the initial traceback trellis unit 920, the traceforward trellis unit 960 performs the traceforward operation on the extracted code symbols stored in the symbol scratchpad 910.

The SISO1 830 and the SISO2 870 are very nearly identical except for the following:

On the SISO1 830, there is a start_siso output which is used to start the SIS02 870; it occurs at after the first frame of the first iteration. There is also a start_output which is used to start the output buffer; it occurs at the end of the last iteration. These signals may be present on the SISO2 870, for commonality, but they are not used.

The SISO1 830 data path gets C1, C2, and C3 from the input buffer (the 2 systematic bits and 1 code bit), whereas the SIS02 870 data path gets only C4 (the other code bit). Gates can be saved by reducing the branch-metric generators and scratchpad RAMs in the data path of the SIS02 870 accordingly.

On the last iteration, the SIS02 870 adds the incoming extrinsic information to its updated extrinsic information to produce the final output; the SISO1 830 just outputs its updated extrinsic information without the extra addition.

On the first iteration, the SISO1 830 zeroes its extrinsic information inputs; the SISO2 870 does not.

Figure 16B:
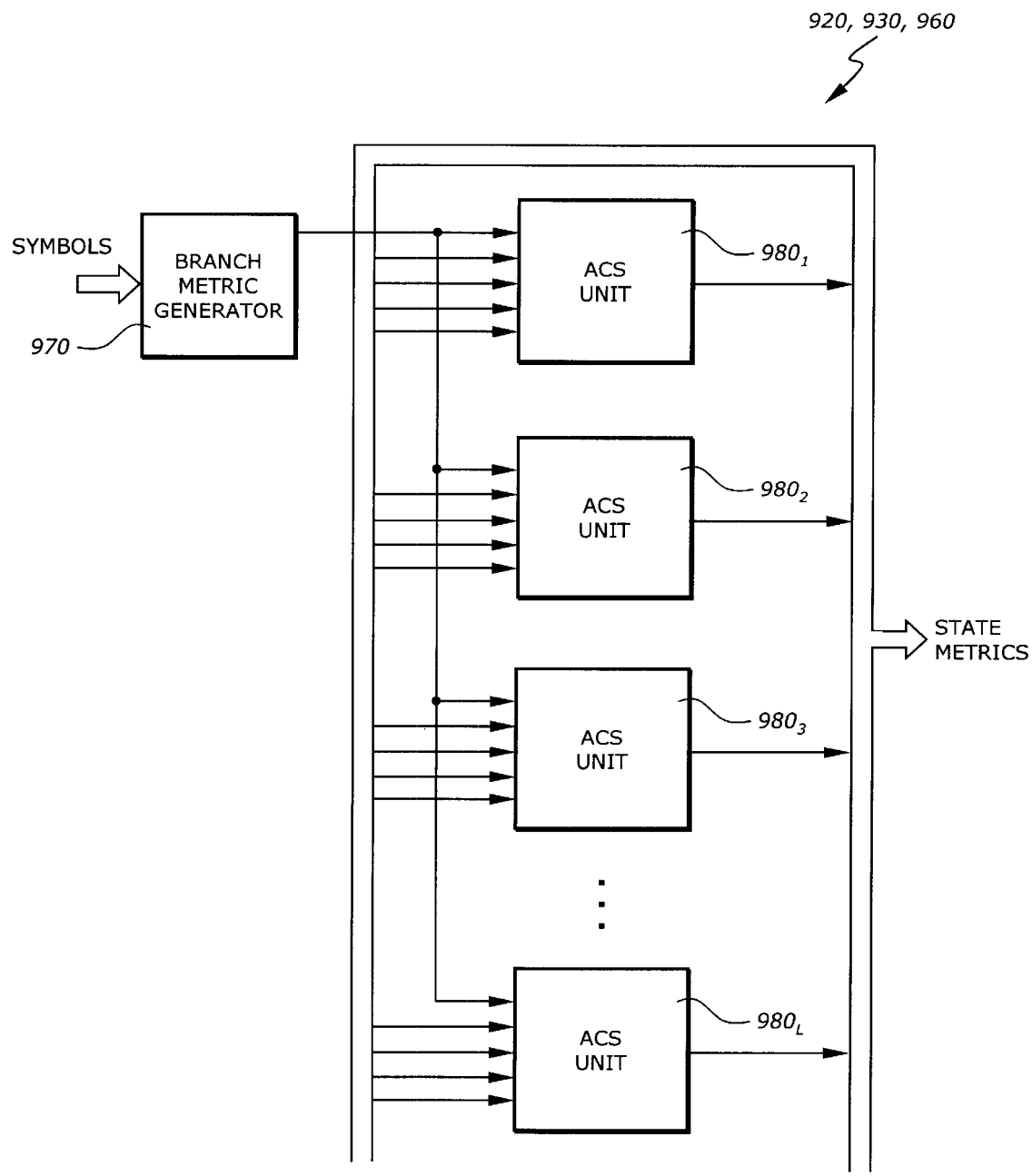
FIG. 16B is a diagram illustrating in detail one of the trellis units shown in FIG. 16A according to a preferred embodiment of the present invention.

FIG. 16B is a diagram illustrating in detail one of the trellis units shown in FIG. 16A according to a preferred embodiment of the present invention. Each of the trellis units includes a branch metric generator 970 and a network of add-compare-select (ACS) units $980_1$ to $980_L$.

The network of the ACS units is connected in such a manner as to represent the state transitions of the code. The branch metric generator 970 computes the likelihood of each possible transition given the starting state, ending state, and received symbol. The branch metrics are distributed to the ACS network, which calculates the cumulative likelihood of each state at each timestep.

Add-Compare-Select (ACS) Unit

Figure 17:
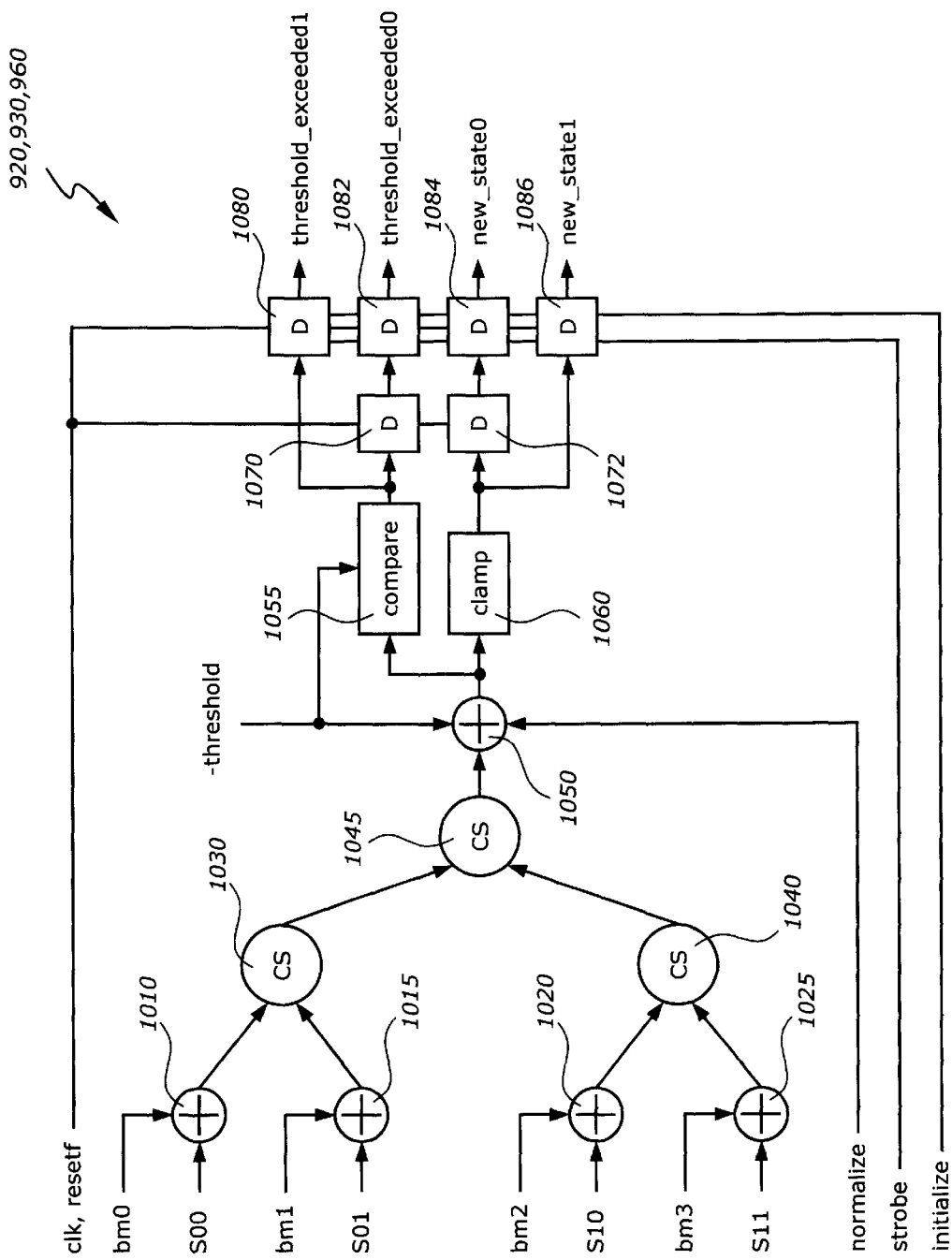
FIG. 17 is a diagram illustrating an ACS unit according to a preferred embodiment of the present invention.

FIG. 17 is a diagram illustrating one of the trellis units 920, 930, and 960 according to a preferred embodiment of the present invention. Each of the trellis unit 920, 930, and 960 includes adders 1010, 1015, 1020, 1025, and 1050, compare-select (CS) 1030, 1040, 1045, comparator 1055, dampers 1060, latches and registers 1070, 1072, 1080, 1082, 1084 and 1086.

The ACS (Add-Compare-Select) unit 980 is the computational core of the SISO. The ACS performs a 4-way "min*" function. Since the ACS unit operates on two bits at a time in the rate 2/3 code, it gets two clock cycles (one "timestep") to do its calculation. Thus hardware can be saved by having each ACS unit calculate two next-states, one on each clock tick. This way, a 16-state trellis needs only 8 ACS units. This design is indeed fast enough (<25 ns) to accomplish the next-state calculation in one clock tick. The ACS unit shown uses about 1100 gates, so the three trellises constructed from these units will total about 26400 gates.

Trellises

Figure 18:
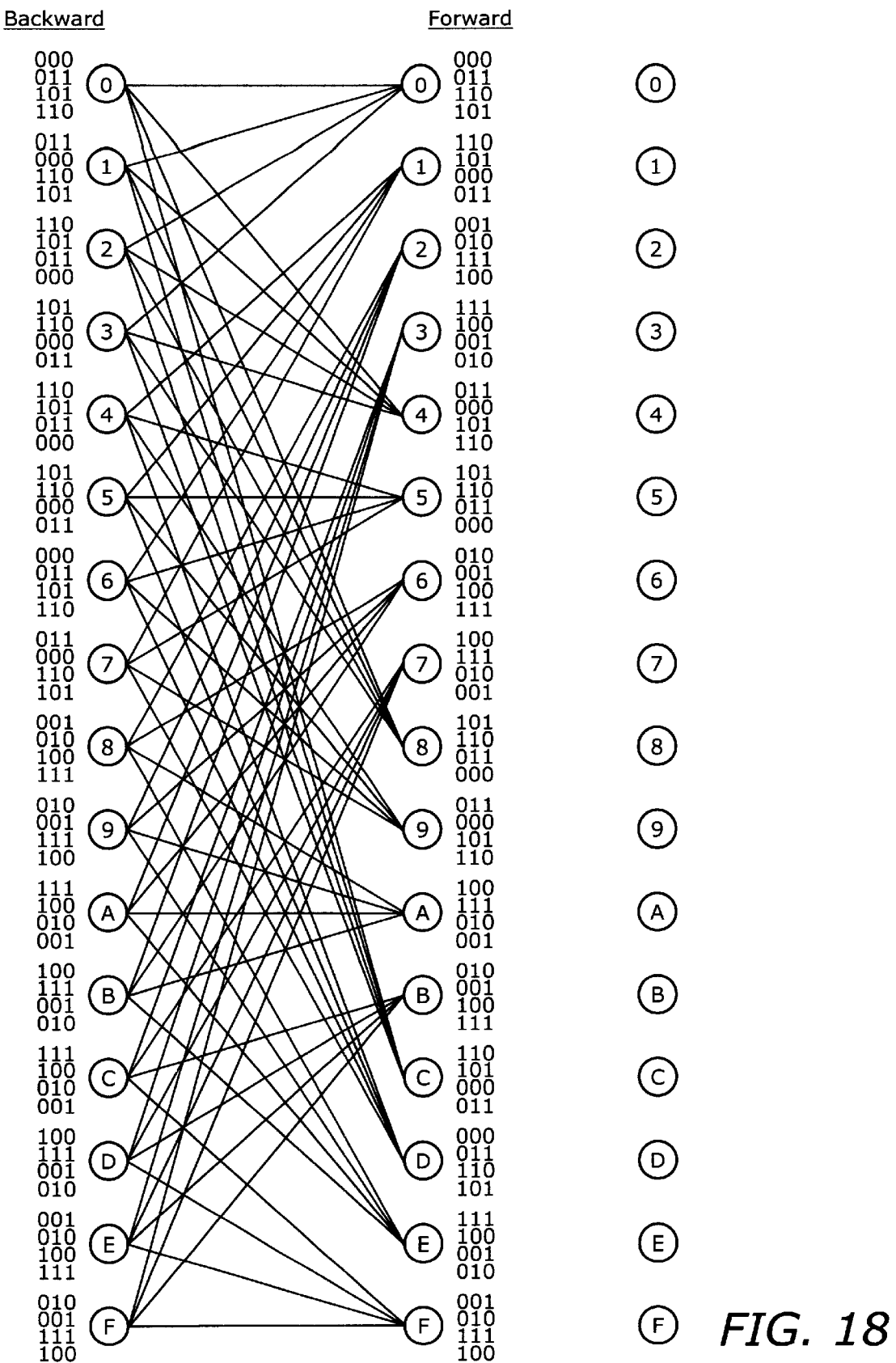
FIG. 18 is a diagram illustrating a trellis diagram according to a preferred embodiment of the present invention.

FIG. 18 is a diagram illustrating a trellis diagram according to a preferred embodiment of the present invention. The three trellises are very similar. Each consists of ACS units interconnected to form the trellis diagram. The 16 states of the diagram (circles in a column) can be divided into "even" and "odd" states, according to the parity of the codewords associated with the incoming edges. Note that all four codewords entering each state have the same parity. Note also that each state has a counterpart of the opposite parity whose four codewords have the opposite logic sense. Finally, all the "even" states come from previous states in the upper half of the diagram and all the "odd" states come from the lower half. These symmetries can be exploited to reduce the quantity of hardware required for the trellis.

The first economy is to use only 8 ACS units. The trellis has two clock ticks (two bit periods=one timestep) to produce the next set of 16 states. If the ACS unit can calculate a next-state in one clock tick, then only 8 of them are needed to calculate 16 states in 2 clock ticks. So on the first tick, the trellis calculates the "even" states using previous states 0–7, and on the second tick, it calculates the "odd" states using previous states 8–15.

The second economy is to use only 4 branch metric calculators. The first tick operation uses only codewords with even parity, so only these four are calculated and distributed. The second tick operation uses only the odd parity codewords, so the same 4 branch metric calculators produce the odd-parity counterparts on the second tick.

The states are assigned to ACS units in such a way that the metrics on the first tick and second tick are simply inverses of each other so the data comes from the same branch metric calculator on both ticks, and there is no need to mux the branch metric inputs.

The two traceback trellises are essentially identical except for their initialization. Traceback BO, the "training" operation, is initialized to all-zero at the start of each Nbl. Traceback BI, the "full" traceback is initialized with the result of the previous BO traceback at the start of each Nbl, except the last one in each frame of N, when it is initialized to all-zero. The tracebacks are connected so as to calculate the left-hand column given the state metrics in the right-hand column. The traceforward trellis calculates the right-hand column given the state metrics in the left. This trellis is initialized only at the start of each frame of N, such that state 0=0 and the others=max.

All three trellises normalize the same way: each ACS unit compares its results to a fixed threshold (1/8 of full scale) and puts out a signal indicating above or below the threshold. If all 16 states are above the threshold, the trellis will normalize on the next cycle. To normalize, the threshold value is subtracted from all metrics simultaneously.

Branch Metric Generators

The three branch-metric generators are identical. They calculate metrics as follows: if the hypothesis bit matches the received information bit, that term of the metric gets zero; if they do not match, the term gets the magnitude of the received information. The final metric is the sum of the terms. In SISO1, the branch metric is the sum of 5 terms: the two extrinsic information bytes (u1 and u2), and 3 received symbol bytes (c1,c2,c3). In SISO2, it is the sum of 3 terms: the extrinsic information bytes again, and one received symbol byte c4. Because the hypothesis codewords are 3 bits, there are 8 possible metrics at every timestep. With 2 clocks per timestep, the even parity metrics are calculated first, then the odd parity metrics. Thus only 4 sums are needed at a time.

Extrinsic Information Calculator

The extrinsic information calculator accepts the state A's and B's, received symbol codeword, and the two extrinsic information values (u1, u2) to calculate the new bitwise extrinsic information. The extrinsic information calculator has two clock cycles to process each codeword; one bit of extrinsic information is calculated on each clock cycle. u1 is calculated when the control signal phase is high and u2 is calculated when phase is low.

Figure 19:
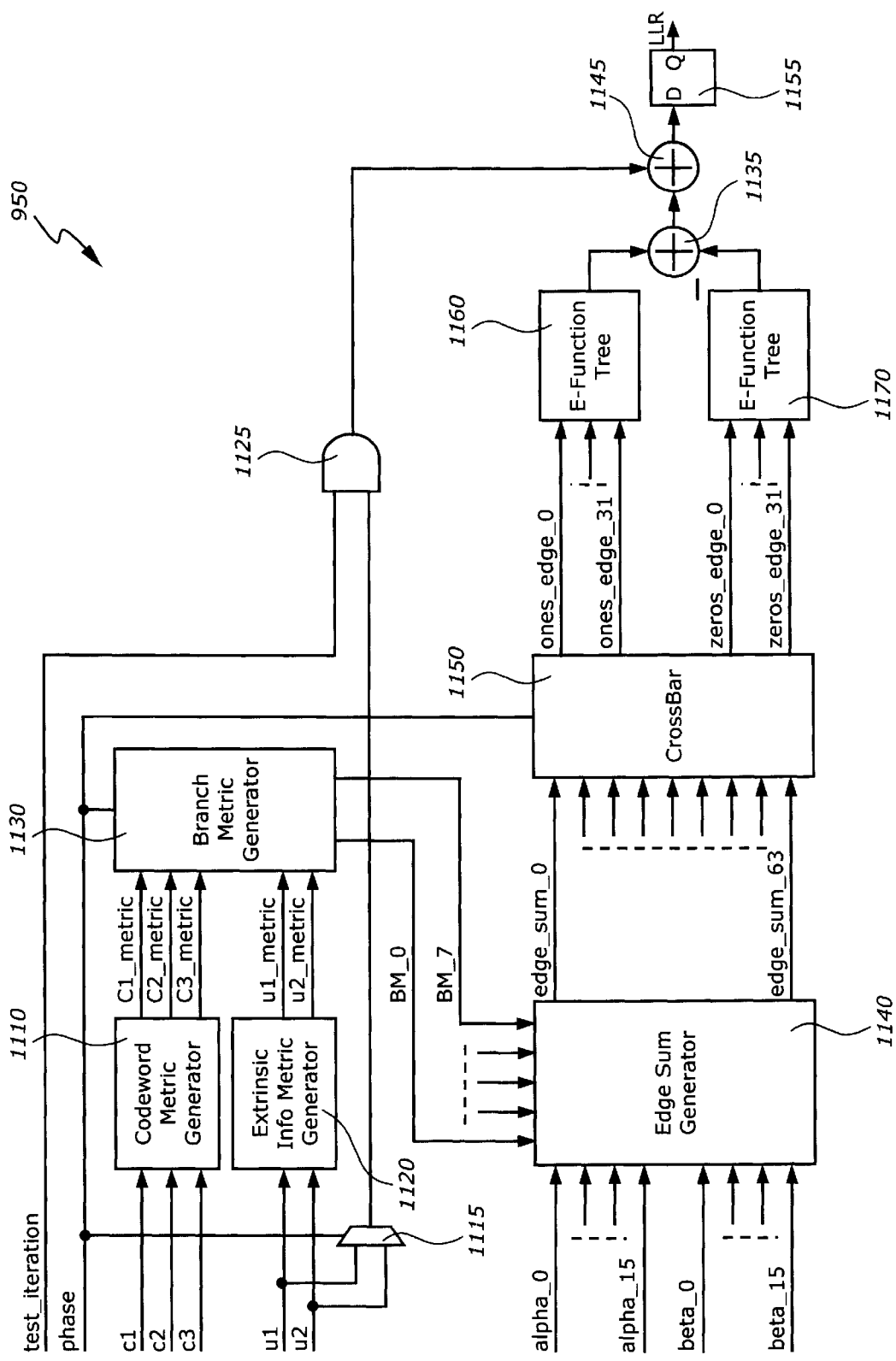
FIG. 19 is a diagram illustrating in detail the extrinsic information calculator shown in FIG. 16 according to a preferred embodiment of the present invention.

FIG. 19 is a diagram illustrating in detail an extrinsic information calculator 950 shown in FIG. 16A according to a preferred embodiment of the present invention. The extrinsic information calculator 950 includes a codeword metric generator 1110, an extrinsic information metric generator 1120, and AND gate 1125, a branch metric generator 1130, an edge sum generator 1140, a crossbar 1150, E-function trees 1160 and 1170, adders 1135 and 1145, and a D flip-flop 1155.

The codeword metric generator 1110 and the extrinsic information metric generator 1120 compute the codeword and extrinsic information metrics according to the following formula: if the input value favors the particular hypothesis then the metric is set to zero, otherwise the metric is set to the magnitude of the input value. The branch metric generator 1130 generates the branch metrics by summing together all three codeword metrics and the extrinsic information metric for the information bit not being calculated. The control signal phase determines which extrinsic information bit is being calculated. All eight possible branch metrics are generated simultaneously and supplied to the edge sum generator 1140. The edge sum generator 1140 adds the appropriate branch metric to the appropriate A's and B's for each edge. One sum for each of the 64 trellis edges is output to the crossbar 1150 sub-block.

The crossbar groups the edges into two groups: one group contains the 32 edge sums that correspond to an information bit of zero and the other group contains the 32 edge sums that correspond to an information bit of one. The members of each group depend on which extrinsic information bit is being calculated. Again, the control signal phase provides this information.

All the members of each group are paired together and fed into the first level of min* generators. The results from the min* generators are again paired together and fed into the second level of min* generators. This continues until there is only a single value left in each group. The zeros value is then subtracted from the ones value to create the extrinsic information value for the information bit.

For the last iteration, the extrinsic information calculator in SISO2 adds the original input extrinsic information value to its newly-calculated extrinsic information before outputting the result. The control signal last_iteration is off during early iterations which zeroes the input extrinsic information value to disable the final addition through the AND gate 1125. The control signal last_iteration is tied off in SISO1.

Symbol Scratchpad and Data Alignment

Four bytes of data arrive from the input buffer every two-clock timestep, two bytes per clock. SISO1 uses both bytes of the first pair and one byte of the second. SISO2 uses the other byte of the second pair. Two bytes arrive from the interleaver/de-interleaver per timestep, serially. All the bytes are aligned into a parallel word and held for the duration of the timestep to be written into the symbol scratchpad 910 and simultaneously presented to the branch metric generator for traceback 1. The alignment register also converts the data from 2's complement to sign+magnitude for the convenience of the rest of the SISO arithmetic.

The symbol scratchpad 910 contains three planes of 128×32 single-port RAM, writing and reading on alternate clock ticks. The depth is determined by the maximum Nbl, the width is the total width of received symbols and extrinsic information. The main reason for the existence of the symbol scratchpad is to simplify the much larger input buffer RAM. Note that the three trellises need to access the received data simultaneously at different locations in the data block. To serve both SISOs, the input buffer would have to have 6 read ports. Instead, each SISO copies the data into its scratchpad the first time it needs it (for traceback 1), then it is available locally for traceback 2 and the traceforward.

Three planes are needed because the traceforward follows three Nbl blocks behind traceback 1 (referring to the timeline in FIG. 15). The new data arriving with traceback 1 overwrites the old immediately after traceforward reads it. Because the writing occurs in reverse time order and the last reading occurs in forward time order, the direction of the address reverses every three Nbl, to avoid overwriting data that has not been read yet. Because the total number of Nbl processed is always a multiple of 3 (because 3 blocks of N are processed at a time), the plane counter and direction will always end up in the same state they started in.

B State Scratchpad

Traceback 2 calculates the B metrics in blocks of Nbl at a time. After traceback 2 takes Nbl timesteps to pass through a block of Nbl backwards, the traceforward will take another Nbl timesteps to pass through the same block forwards and calculate the A metrics. Following right behind the traceforward, the extrinsic information calculator takes the A metrics just finished and reads the B metrics calculated Nbl timesteps ago, and calculates the new extrinsic information. Simultaneously, traceback 2 is calculating a new set of B metrics and overwriting the old B metrics just read out. The B metrics are stored in the B scratchpad 940, a single 128×(16×8) RAM (which actually may be implemented as several (4) RAMs in parallel to get sufficient width), writing and reading on alternate clock ticks. Like the symbol scratchpad 910, the writing and reading are in opposite time order, so the direction of addressing reverses every Nbl block. But unlike the symbol scratchpad 910, the direction may not end up in the same state it started in, because the total number of Nbl blocks processed is not necessarily even (if Nbl_per_N is odd and num_iterations is odd, the total will be odd and the direction will be the reverse of what it started with). To avoid overwriting if a new block of 3 N starts up before the last one finishes, the address direction will simply start up in the state it was last in, rather than resetting to the initial state.

Control Path

The SISO has three control modules, one associated with each trellis. They count off the Nbl blocks, Nbl per N, 3 N per iteration, and the number of iterations, and generate the read and write addresses and appropriate control signals for their trellises. Each controller receives a start signal and runs to completion, signaling the next one to start at the appropriate time. Upon completion of its cycle, the controller stops and returns to an idle state until another start arrives. In the idle state, control signals are held off to reduce power consumption in the data path. If start arrives at the very last step in the cycle, it proceeds without pause into the next cycle. If start arrives before the cycle is complete, the controller restarts immediately, destroying data already in the pipeline. But this case can only occur if the decoder's throughput capacity is exceeded (operator error) or when resynchronizing in FDMA mode, in which case the data in the pipe is garbage anyway. The global initialize signal sets the controllers back to their initial idle state, awaiting a start signal to begin operation.

The functions of the controllers are: (1) count off the timesteps, blocks, and iterations; (2) generate read and write addresses and enables for the RAMs; (3) initialize and enable the trellises; (4) signal (start_out) the next controller in line to begin.

The three controllers in each SISO are essentially the same, except for the following: (1) Address generation arithmetic: each produces a read address and a write address but all differ in the details of count up vs count down, modulus, pipeline delays, etc; (2) When to issue the start_out signal: TB1, at the end of the second Nbl per cycle; TB2, at the end of the first Nbl per cycle; TF, at the end of the first N of the first iteration; and (3) When to initialize its trellis: TB1, at the start of every Nbl; TB2, at the start of every Nbl, with a qualifier that indicates "clear to zero" on the last Nbl of every N or "preload TB1 results" on all other Nbl's; TF, at the start of every N.

The present invention discloses a method and apparatus for an efficient implementation of a turbo encoder and turbo decoder. The technique provides a fast processing time with reduced hardware.

While the invention has been described with reference to an illustrative embodiment, this description is not intended to be construed in a limiting sense. Various modifications of the illustrative embodiment, as well as other embodiments of the invention, which are apparent to persons skilled in the art to which the invention pertains, are deemed to lie within the spirit and scope of the invention.

What is claimed is:

1. An apparatus comprising:
   an interleaver to interleave and delay a block of input bits, the interleaver generating interleaved input bits and delayed input bits;
   a serial-to-parallel converter coupled to the interleaver to pair consecutive bits of one of the interleaved and delayed input bits;
   a first encoder coupled to the serial-to-parallel converter to generate a first, second, and third encoded bits from the paired bits;
   a second encoder coupled to the serial-to-parallel converter to generate a fourth encoded bit; and
   a symbol generator coupled to the first and second rate encoders to generate a plurality of symbols, the symbols corresponding to combinations of input bits.

2. The apparatus of claim 1 wherein the interleaver comprises:
   an interleaver memory to provide the interleaved input bits and the delayed input bits;
   a counter coupled to the interleaver memory to generate addresses to the interleaver memory; and
   a look-up table (LUT) memory coupled to the counter to generate a random address to the interleaver memory.

3. The apparatus of claim 2 wherein the interleaver further comprises:
   a multiplexer coupled to the interleaver memory to select the delayed input bits and the interleaved input bits; and
   a latch circuit coupled to the multiplexer to latch the delayed input bits and the interleaved input bits.

4. The apparatus of claim 1 wherein the delayed input bits include a first delayed bit (su1), a second delayed bit (su2) and the interleaved input bits include a first interleaved input bit (su1') and a second interleaved input bit (su2').

5. The apparatus of claim 4 wherein two consecutive input bits are paired to generate parallel bits in a same clock cycle.

6. The apparatus of claim 5 wherein the parallel bits include a first parallel delayed bit (pu1), a second parallel delayed bit (pu2), a first parallel interleaved bit (pu1'), and a second parallel interleaved bit (pu2'), the pu1, pu2, pu1', and pu2'bits corresponding to the su1, su2, su1', and su2' bits, respectively, the pu1 and pu2 bits forming a delayed bit pair, the pu1' and pu2' bits forming an interleaved bit pair.

7. The apparatus of claim 6 wherein the first and second encoders are rate ⅔ systematic recursive convolutional.

8. The apparatus of claim 7 wherein the first encoder comprises a state machine coupled to receive the delayed bit pair, the state machine having four states s0, s1, s2, and s3, the state machine generating four next states ns0, ns1, ns2, and ns3.

9. The apparatus of claim 8 wherein the four next states are generated from the four states and the delayed bit pair according to four state equations ns0 =s2+s1+pu1, ns1=s0, ns2=s3+s2+s1+pu2, and ns3=s2, respectively.

10. The apparatus of claim 9 wherein the first, second, and third encoded bits are generated as pu1, pu2, and s0+pu2+pu1, respectively.

11. The apparatus of claim 7 wherein the second encoder comprises a state machine coupled to receive the interleaved bit pair, the state machine having four states s0, s1, s2, and s3, the state machine generating four next states ns0, ns1, ns2, and ns3.

12. The apparatus of claim 11 wherein the four next states are generated from the four states and the interleaved bit pair according to four state equations ns0=s2+s1+pu1', ns1=s0, ns2=s3+s2+s1+pu2', and ns3=s2, respectively.

13. The apparatus of claim 12 wherein the fourth encoded bit is generated as s0+pu2'+pu1'.

14. The apparatus of claim 13 wherein the symbol generator combines the encoded bits to form the symbols which include an Inphase (I) symbol and a quadrature (Q) symbol.

15. The apparatus of claim 14 wherein the I symbol includes the first and second encoded bits and the Q symbol includes the third and fourth encoded bits, the first and third encoded bits appearing first in time, the second and fourth encoded bits appearing second in time.

16. A system comprising:
   an encoder to receive a stream of input bits to generate encoded bits from the input bits, the encoded bits forming an Inphase (I) and quadrature (Q) symbols the encoder comprising an interleaver to interleave and delay the input bits, and a serial-to-parallel converter to pair consecutive bits of one of the interleaved and delayed input bits;

a sync inserter coupled to the encoder to insert synchronizing pattern into the encoded bits, the sync inserter generating output bits; and a latch and routing circuit coupled to the encoder and the sync inserter to latch the input and output bits and to route signal paths bypassing the encoder and the sync inserter.

17. The system of claim 16 further comprising a control and bus interface coupled to the encoder, the sync inserter, and the latch and routing circuit, to generate control signals.

18. The system of claim 16 wherein the sync inserter comprises:

a frame counter to keep track of a frame number, the frame counter being cleared when the frame number reaches a predetermined frame count;

a bit counter to keep track of a bit number, the bit counter being cleared when the bit number reaches a predetermined bit count; and a look up table (LUT) coupled to the bit counter to generate the synchronizing pattern according to the bit number.

19. The system of claim 18 wherein the LUT stores Inphase (I) and quadrature (Q) synchronizing patterns.

20. The system of claim 18 wherein the sync inserter selects the encoded bits when the synchronizing pattern is not generated.

21. An apparatus comprising:

a sync search engine coupled to receive channel symbols representing a plurality of encoded bits to detect a synchronizing pattern using search, trial lock, and lock states, the sync search engine extracting code symbols from the channel symbols;

an input buffer coupled to the sync search engine to store the extracted code symbols;

a first soft-in-soft-out (SISO1) coupled to the input buffer to generate a first soft decision set based on the extracted code symbols;

an interleaver coupled to the SISO1 to interleave the first soft decision set;

a second soft-in-soft-out (SISO2) coupled to the input buffer and the interleaver to generate a second soft decision set;

a de-interleaver coupled to the SISO2 to de-interleave the second soft decision set; and an adder coupled to the SISO1 and the de-interleaver to generate a hard decision set.

22. The apparatus of claim 21 wherein the sync search engine comprises correlators, each of the correlators generating a correlator score based on a detection of the synchronizing pattern in a different phase orientation.

23. The apparatus of claim 22 wherein the sync search engine produces a final score based on the correlator scores generated by the correlators.

24. The apparatus of claim 23 wherein the synchronizing pattern is detected when the final score exceeds a predetermined threshold.

25. The apparatus of claim 21 wherein the input buffer comprises:

a first port to receive the extracted code symbols;

a second port coupled to the SISO1 to transmit the stored code symbols to the SISO1; and a third port coupled to the SISO2 to transmit the stored code symbols to the SISO2.

26. The apparatus of claim 21 wherein each of the SISO1 and SISO2 comprises:

a symbol scratchpad coupled to the input buffer to store at least three sets of extracted code symbols, each set having Nb1 extracted code symbols;

a first trellis unit coupled to the input buffer to perform an initial traceback operation, the first trellis unit generating a first traceback result;

a second trellis unit coupled to the symbol scratchpad and the first trellis unit to perform a full traceback operation, the second trellis unit generating a second traceback result;

a third trellis unit coupled to the symbol scratchpad to perform a traceforward operation, the third trellis unit generating a traceforward result;

a state scratchpad coupled to the second trellis unit to store the second traceback result at a rate of Nbl symbols at a time;

an extrinsic information calculator coupled to the symbol scratchpad, the state scratchpad, and the third trellis unit to compute an extrinsic information.

27. The apparatus of claim 26 wherein each of the first, second, and third trellis units comprises:

a branch metric calculator to calculate a branch metric; and a plurality of add-compare-select (ACS) units connected according to a code topology, each of the ACS units performing a four-way min* function.

28. The apparatus of claim 27 wherein extracted symbols include first, second, third, and fourth encoded bits.

29. The apparatus of claim 26 wherein the SISO1 receives the first, second, and third encoded bits and the SISO2 receives the fourth encoded bit.

30. The apparatus of claim 21 wherein the interleaver and de-interleaver are combined into a single unit comprising three planes of memory, each of the three planes of memory storing N extrinsic information symbols.

31. A method comprising:

detecting a synchronizing pattern by a sync search engine using search, trial lock, and lock states, the sync search engine extracting code symbols from channel symbols representing a plurality of encoded bits;

storing the extracted code symbols in an input buffer;

generating a first soft decision set based on the extracted code symbols by a first soft-in-soft-out (SISO1);

interleaving the first soft decision set by an interleaver;

generating a second soft decision set by a second soft-in-soft-out (SISO2);

de-interleaving the second soft decision set by a de-interleaver; and generating a hard decision set by an adder.

32. The method of claim 31 wherein detecting a synchronizing pattern comprises generating a correlator score based on a detection of the synchronizing pattern by a plurality of correlators.

33. The method of claim 32 wherein detecting a synchronizing pattern further comprising producing a final score based on the correlator scores generated by the correlators.

34. The method of claim 33 wherein the synchronizing pattern is detected when the final score exceeds a predetermined threshold.

35. The method of claim 31 wherein storing the extracted code symbols comprises:

receiving the extracted code symbols by a first port;

transmitting the stored code symbols to the SISO1 by a second port; and transmitting the stored code symbols to the SISO2 by a third port.

36. The method of claim 31 wherein generating one of the first and second soft decision sets comprises:

storing at least three sets of extracted code symbols in a symbol scratchpad, each set having Nbl extracted code symbols;

performing an initial traceback operation by a first trellis unit, the first trellis unit generating a first traceback result;

performing a full traceback operation by a second trellis unit, the second trellis unit generating a second traceback result;

performing a traceforward operation by a third trellis unit, the third trellis unit generating a traceforward result;

storing the second traceback result in a state scratchpad at a rate of Nbl symbols at a time; and computing an extrinsic information by an extrinsic information calculator.

37. The method of claim 36 wherein each of performing an initial traceback, a full traceback, and a traceforward operations comprises:

calculating a branch metric by a branch metric calculator; and performing a four-way min* function by each of a plurality of add-compare-select (ACS) units, the ACS units being connected according to a code topology.

38. The method of claim 37 wherein extracted code symbols include first, second, third, and fourth encoded bits.

39. The method of claim 36 wherein the SISO1 receives the first, second, and third encoded bits and the SISO2 receives the fourth encoded bit.

40. The method of claim 36 wherein the interleaver and de-interleaver are combined into a single unit comprising three planes of memory, each of the three planes of memory storing N extrinsic information symbols.

41. A system comprising:

an encoder to encode input bits using a turbo code, the encoder comprising:

an interleaver to interleave and delay a block of the input bits, the interleaver generating interleaved input bits and delayed input bits, a serial-to-parallel converter coupled to the interleaver to pair consecutive bits of one of the interleaved and delayed input bits;

a first encoder coupled to the serial-to-parallel converter to generate a first, second, and third encoded bits from the paired bits, a second encoder coupled to the serial-to-parallel converter to generate a fourth encoded bit from the paired bits, and a symbol generator coupled to the first and second rate encoders to generate a plurality of symbols, the symbols corresponding to combinations of input bits; and a modulator coupled to the encoder to modulate the plurality of symbols, the modulator generating encoded bits corresponding to the plurality of symbols.

42. The system of claim 41 wherein the interleaver comprises:

an interleaver memory to provide the interleaved input bits and the delayed input bits;

a counter coupled to the interleaver memory to generate addresses to the interleaver memory; and a look-up table (LUT) memory coupled to the counter to generate a random address to the interleaver memory.

43. The system of claim 42 wherein the interleaver further comprises:

a multiplexer coupled to the interleaver memory to select the delayed input bits and the interleaved input bits; and a latch circuit coupled to the multiplexer to latch the delayed input bits and the interleaved input bits.

44. The system of claim 41 wherein the delayed input bits include a first delayed bit (su1), a second delayed bit (su2) and the interleaved input bits include a first interleaved input bit (su1') and a second interleaved input bit (su2').

45. The system of claim 44 wherein two consecutive input bits are paired to generate parallel bits in a same clock cycle.

46. The system of claim 45 wherein the parallel bits include a first parallel delayed bit (pu1), a second parallel delayed bit (pu2), a first parallel interleaved bit (pu1'), and a second parallel interleaved bit (pu2'), the pu1, pu2, pu1', and pu2' bits corresponding to the su1, su2, su1', and su2' bits, respectively, the pu1 and pu2 bits forming a delayed bit pair, the pu1' and pu2' bits forming an interleaved bit pair.

47. The system of claim 46 wherein the first and second encoders are rate ⅔ systematic recursive convolutional.

48. The system of claim 47 wherein the first encoder comprises a state machine coupled to receive the delayed bit pair, the state machine having four states s0, s1, s2, and s3, the state machine generating four next states ns0, ns1, ns2, and ns3.

49. The system of claim 48 wherein the four next states are generated from the four states and the delayed bit pair according to four state equations ns0=s2+s1+pu1, ns1=s0, ns2=s3+s2+s2+pu2, and ns3=s2, respectively.

50. The system of claim 49 wherein the first, second, and third encoded bits are generated as pu1, pu2, and s0+pu2+pu1, respectively.

51. The system of claim 47 wherein the second encoder comprises a state machine coupled to receive the interleaved bit pair, the state machine having four states s0, s1, s2, and s3, the state machine generating four next states ns0, ns1, ns2, and ns3.

52. The system of claim 51 wherein the four next states are generated from the four states and the interleaved bit pair according to four state equations ns0=s2+s1+pu1', ns1=s0, ns2=s3+s2+s1+pu2', and ns3=s2, respectively.

53. The system of claim 52 wherein the fourth encoded bit is generated as s0+pu2'+pu1'.

54. The system of claim 53 wherein the symbol generator combines the encoded bits to form the symbols which include an Inphase (I) symbol and a quadrature (Q) symbol.

55. The system of claim 54 wherein the I symbol includes the first and second encoded bits and the Q symbol includes the third and fourth encoded bits, the first and third encoded bits appearing first in time, the second and fourth encoded bits appearing second in time.

56. A system comprising:

a demodulator to demodulate a stream of encoded bits, the demodulator generating channel symbols representing the encoded bits; and a decoder coupled to the demodulator to decode the channel symbols, the decoder comprising:

a sync search engine coupled to receive the channel symbols to detect a synchronizing pattern using search, trial lock, and lock, the sync search engine extracting code symbols from the channel symbols, an input buffer coupled to the sync search engine to store the extracted code symbols, a first soft-in-soft-out (SISO1) coupled to the input buffer to generate a first soft decision set based on the extracted code symbols, an interleaver coupled to the SISO1 to interleave the first soft decision set, a second soft-in-soft-out (SISO2) coupled to the input buffer and the interleaver to generate a second soft decision set, a de-interleaver coupled to the SISO2 to de-interleave the second soft decision set, and an adder coupled to the SISO1 and the de-interleaver to generate a hard decision set.

57. The system of claim 56 wherein the sync search engine comprises correlators, each of the correlators generating a correlator score based on a detection of the synchronizing pattern in a different phase orientation.

58. The system of claim 57 wherein the sync search engine produces a final score based on the correlator scores generated by the correlators.

59. The system of claim 58 wherein the synchronizing pattern is detected when the final score exceeds a predetermined threshold.

60. The system of claim 56 wherein the input buffer comprises:

a first port to receive the extracted code symbols;

a second port coupled to the SISO1 to transmit the stored code symbols to the SISO1; and a third port coupled to the SISO2 to transmit the stored code symbols to the SISO2.

61. The system of claim 56 wherein each of the SISO1 and SISO2 comprises:

a symbol scratchpad coupled to the input buffer to store at least three sets of extracted code symbols, each set having Nbl extracted code symbols;

a first trellis unit coupled to the input buffer to perform an initial traceback operation, the first trellis unit generating a first traceback result;

a second trellis unit coupled to the symbol scratchpad and the first trellis unit to perform a full traceback operation, the second trellis unit generating a second traceback result;

a third trellis unit coupled to the symbol scratchpad to perform a traceforward operation, the third trellis unit generating a traceforward result;

a state scratchpad coupled to the second trellis unit to store the second traceback result at a rate of Nbl symbols at a time;

an extrinsic information calculator coupled to the symbol scratchpad, the state scratchpad, and the third trellis unit to compute an extrinsic information.

62. The system of claim 61 wherein each of the first, second, and third trellis units comprises:

a branch metric calculator to calculate a branch metric; and a plurality of add-compare-select (ACS) units connected according to a code topology, each of the ACS units performing a four-way min* function.

63. The system of claim 62 wherein extracted symbols include first, second, third, and fourth encoded bits.

64. The system of claim 61 wherein the SISO1 receives the first, second, and third encoded bits and the SISO2 receives the fourth encoded bit.

65. The system of claim 56 wherein the interleaver and de-interleaver are combined into a single unit comprising three planes of memory, each of the three planes of memory storing N extrinsic information symbols.

* * * * *